(12) United States Patent
Tani et al.

(10) Patent No.: US 6,936,478 B2
(45) Date of Patent: Aug. 30, 2005

(54) FERROELECTRIC CAPACITOR WITH DIELECTRIC LINING, SEMICONDUCTOR MEMORY DEVICE EMPLOYING SAME, AND FABRICATION METHODS THEREOF

(75) Inventors: Kouichi Tani, Tokyo (JP); Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/429,751

(22) Filed: May 6, 2003

(65) Prior Publication Data

US 2003/0201478 A1 Oct. 30, 2003

Related U.S. Application Data

(62) Division of application No. 09/482,538, filed on Jan. 14, 2000, now Pat. No. 6,600,185.

(30) Foreign Application Priority Data

Mar. 10, 1999 (JP) ............................................ 11-064020
Mar. 16, 1999 (JP) ............................................ 11-069419

(51) Int. Cl.[7] ......................... H01L 21/00; H01L 21/20
(52) U.S. Cl. ........................... 438/3; 438/238; 438/239; 438/386; 438/399; 257/296; 257/295; 257/298
(58) Field of Search ............................ 438/3, 238, 239, 438/386, 399; 257/296, 295, 298

(56) References Cited

U.S. PATENT DOCUMENTS

| | | | |
|---|---|---|---|
| 5,489,548 A | 2/1996 | Nishioka et al. | |
| 5,654,222 A | 8/1997 | Sandhu et al. | |
| 5,985,731 A | 11/1999 | Weng et al. | |
| 6,046,469 A | 4/2000 | Yamazaki et al. | |
| 6,093,575 A | 7/2000 | Eguchi | |
| 6,174,822 B1 | 1/2001 | Nagano et al. | |
| 6,215,646 B1 | 4/2001 | Ochiai et al. | |
| 6,600,185 B1 * | 7/2003 | Tani et al. ................... | 257/296 |

OTHER PUBLICATIONS

T. Kachi et al., "A Scalable Single–transistor/single–capacitor Memory Cell Structure Characterized by an Angled–capacitor Layout For Megabit FeRAMs", 1998 IEEE.

* cited by examiner

*Primary Examiner*—Allan R. Wilson
*Assistant Examiner*—Joseph Nguyen
(74) *Attorney, Agent, or Firm*—Volentine Francos & Whitt, PLLC

(57) ABSTRACT

A ferroelectric capacitor has a top electrode, a bottom electrode, a ferroelectric body disposed between the top and bottom electrodes, and a dielectric lining disposed below the top electrode and above the bottom electrode, protecting the sides of the ferroelectric body. The ferroelectric body can be formed by chemical-mechanical polishing of a ferroelectric film. In a memory device, the capacitor is coupled to a transistor. The dielectric lining protects the ferroelectric body from etching damage during the fabrication process, obviating the need for repeated annealing to repair such damage, thereby avoiding the alteration of transistor characteristics that would be caused by such annealing.

24 Claims, 23 Drawing Sheets

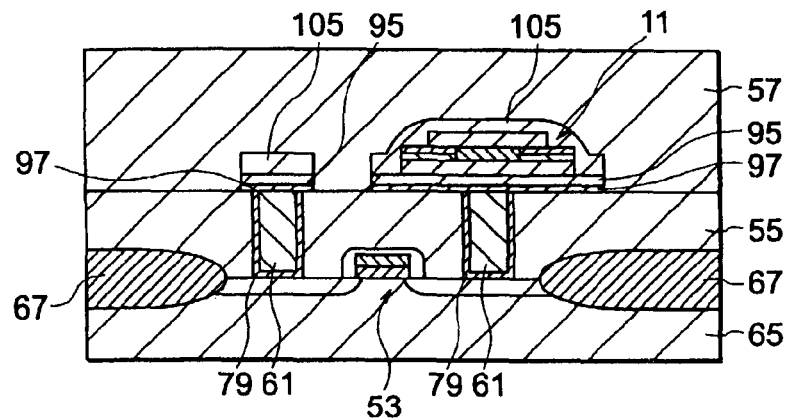
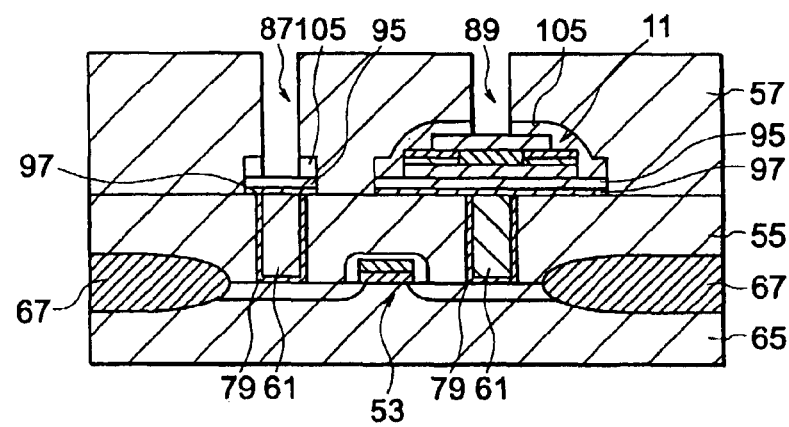
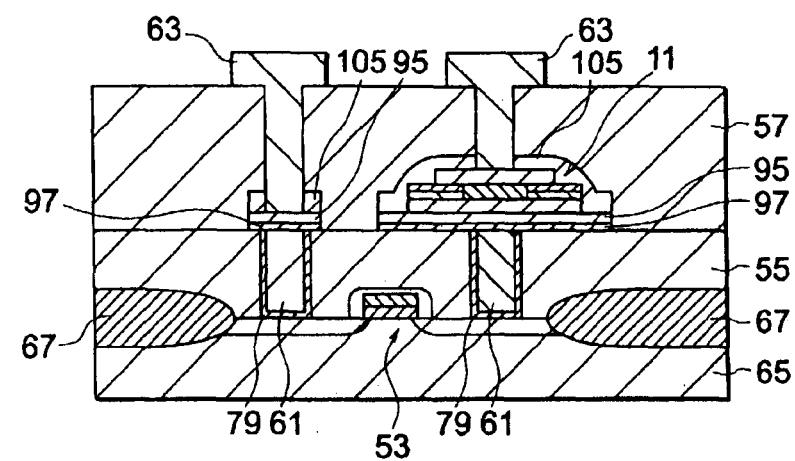

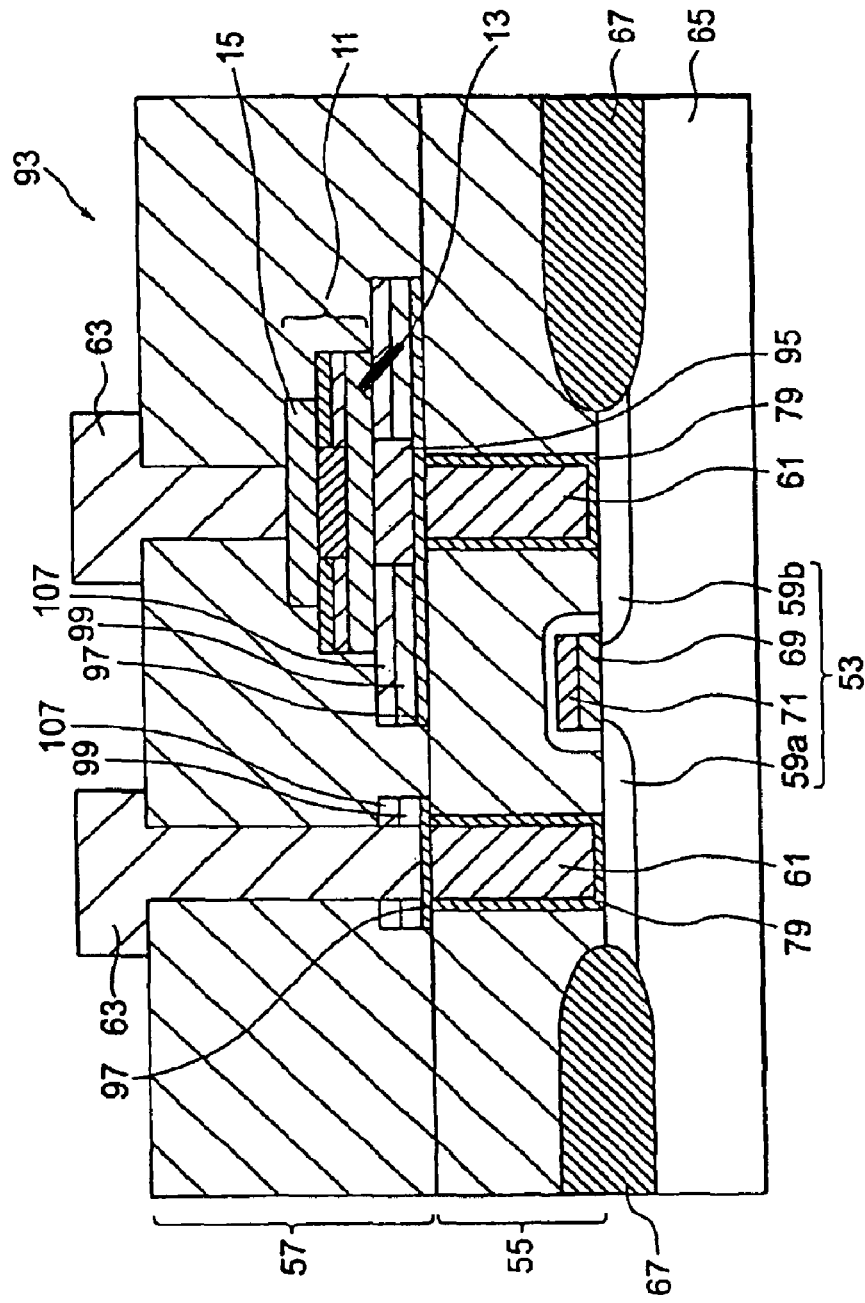

FERROELECTRIC CAPACITOR WITH DIELECTRIC LINING, SEMICONDUCTOR MEMORY DEVICE EMPLOYING SAME, AND FABRICATION METHODS THEREOF

CROSS-REFERENCE TO RELATED APPLICATIONS

This is a divisional of application of application Ser. No. 09/482,538, filed Jan. 14, 2000 U.S. Pat. No. 6,600,185, which is hereby incorporated herein by reference in its entirety for all purposes.

BACKGROUND OF THE INVENTION

The present invention relates to a ferroelectric capacitor, a semiconductor memory device employing the ferroelectric capacitor, and fabrication methods for the capacitor and memory device.

One application of the invention is in ferroelectric random-access memory (FeRAM), a type of non-volatile memory featuring high write endurance and low power consumption. Already employed in electronic devices requiring this combination of features, FeRAM is viewed as a promising future replacement for present static, dynamic, and flash memory devices.

A typical FeRAM memory cell comprises a switching transistor and a ferroelectric capacitor. The ferroelectric capacitor may be stacked over the transistor, or disposed to one side in a planar arrangement. The ferroelectric capacitor comprises a ferroelectric body disposed between two electrodes. In the conventional fabrication process, the ferroelectric material and electrode material are patterned by etching.

A problem encountered in the fabrication of conventional ferroelectric memory devices is that etching disrupts the crystal structure of the ferroelectric material and introduces unwanted impurities. This type of damage is caused both when the ferroelectric material itself is etched, and when an underlying layer such as the bottom electrode layer is etched. To repair the damage, the device must be repeatedly annealed during the fabrication process, but this repeated annealing tends to alter transistor characteristics, leading to a memory device that does not perform as designed.

The damage caused during the etching of underlying layers can be avoided by using an etching mask to protect the ferroelectric layer, so that it is not exposed to the etching plasma, but this increases the cost of the fabrication process.

The damage caused by etching of the ferroelectric material itself cannot be avoided in this way. Moreover, typical ferroelectric materials, such as bismuth strontium titanate (BST) and lead zirconium titanate (PZT), must be heated to a high temperature to form the desired crystalline structure, and must be annealed at an equally high temperature to repair damage to the crystalline structure. In particular, BST, which has the advantage of a longer lifetime than PZT, must be heated to a temperature of at least seven hundred fifty degrees Celsius (750° C.). Repeated annealing at this high a temperature can markedly alter transistor characteristics.

In a ferroelectric memory device with a stacked-capacitor structure, the bottom electrode is often made of platinum, which has an undesirable tendency to react with the polysilicon plug coupling the bottom electrode to the switching transistor. This unwanted reaction can be suppressed by providing an intervening barrier film of titanium or titanium nitride. Under repeated high-temperature annealing, however, the unwanted reaction may take place despite the barrier film. As a result, platinum-polysilicon electrical continuity is degraded.

A further problem caused by etching, particularly by dry etching, is that it creates a ferroelectric capacitor with sloping sides, which wastes space and limits integration density. A still further problem caused by dry etching and other techniques that are employed, such as ion milling, is that the damage they cause to the edges of the ferroelectric body in the capacitor can lead to badly misshapen capacitor configurations, particularly in highly integrated memory devices with small dimensions.

SUMMARY OF THE INVENTION

It is accordingly an object of the present invention to protect the ferroelectric material in a ferroelectric capacitor from etching damage.

Another object of the invention is to increase the integration density of a memory device employing ferroelectric capacitors.

Another object is to simplify the fabrication of a memory device employing ferroelectric capacitors.

The invented capacitor has a top electrode, a bottom electrode, a ferroelectric body disposed between the top electrode and the bottom electrode, and a dielectric lining disposed below the top electrode and above the bottom electrode, protecting the sides of the ferroelectric body.

The invention also provides a fabrication process for the invented capacitor, comprising the steps of:

(a) forming a bottom electrode film on a substrate;

(b) forming a dielectric film on the bottom electrode film;

(c) creating a hole in the dielectric film;

(d) forming a ferroelectric film covering the dielectric film and filling the hole;

(e) removing the ferroelectric film from above the dielectric film, leaving a ferroelectric body in the hole;

(f) forming a top electrode film covering the dielectric film and ferroelectric body;

(g) patterning the top electrode film to form the top electrode;

(h) patterning the first dielectric film to form the dielectric lining; and (i) patterning the bottom electrode film to form the bottom electrode.

Step (e) is preferably performed by chemical-mechanical polishing, thereby avoiding etching damage to the ferroelectric body.

Steps (g), (h), and (i) may be carried out with a single mask, the shape of which is transferred to the top electrode, dielectric lining, and bottom electrode. A compact capacitor with straight sides, aligned perpendicular to the substrate, is thereby created. This capacitor is particularly suitable for high-density integration.

The invention also provides a planar memory element incorporating the invented capacitor, and a process for fabricating the planar memory element.

The invention furthermore provides a stacked memory element incorporating the invented capacitor, and a process for fabricating the stacked memory element. In the stacked memory element, the capacitor is disposed above a transistor, separated from the transistor by an interlayer dielectric film. The bottom electrode of the capacitor is electrically coupled to an electrode of the transistor by a conductor disposed in a contact hole in the interlayer dielectric film. A barrier layer may be provided between the bottom electrode and the conductor, to prevent unwanted chemical reactions. The barrier layer may be surrounded by another dielectric film and may be formed by chemical-mechanical polishing.

Fabrication of the invented memory elements is simplified in that the ferroelectric body in the capacitor is protected from etching damage, so repeated annealing to repair such damage is not necessary.

Forming the barrier layer in a stacked memory element by chemical-mechanical polishing instead of etching also simplifies the fabrication process, when the barrier layer comprises a material that is difficult to etch.

BRIEF DESCRIPTION OF THE DRAWINGS

In the attached drawings:

FIGS. 28, 29, 30, 31, 32, and 33 illustrate steps in the fabrication of the memory cell in FIG. 27;

FIG. 34 is a sectional view of another stacked memory cell embodying the invention;

DETAILED DESCRIPTION OF THE INVENTION

Figure 1:
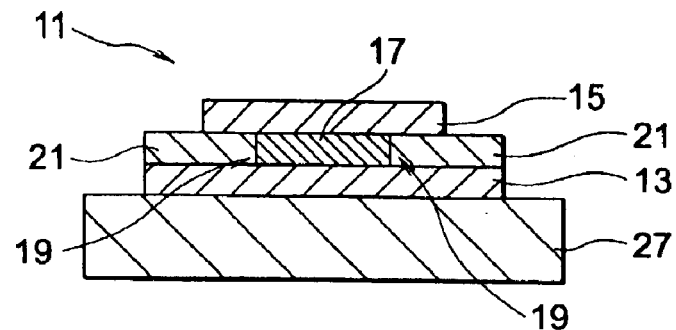
FIGS. 1, 2, and 3 are sectional views of three ferroelectric capacitors embodying the invention.

Embodiments of the invention will be described with reference to the attached drawings, in which like parts are indicated by like reference characters. The drawings are schematic and do not attempt to show the precise relative sizes or thicknesses of films, layers, and other parts. Detailed descriptions of specific fabrication processes will be given, but the invention is not limited to the materials, numerical values, and equipment mentioned in the descriptions.

Figure 2:
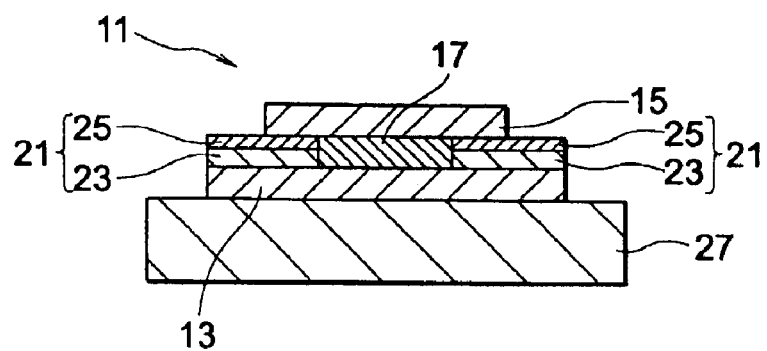
Figure 3:
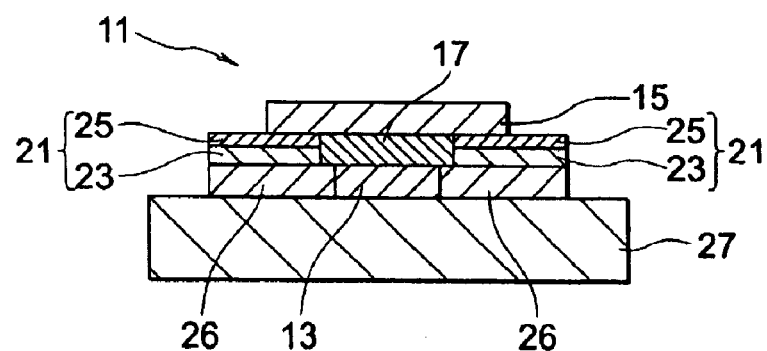

The first embodiment is a ferroelectric capacitor. FIGS. 1, 2, and 3 illustrate cross-sections of three variations of the basic structure of the first embodiment. The capacitor 11 comprises a bottom electrode 13, a top electrode 15, and a ferroelectric body 17. The sides 19 of the ferroelectric body 17 are surrounded by a dielectric lining 21 that protects the ferroelectric body 17 during etching. In the variations in FIGS. 2 and 3, the dielectric lining 21 comprises a dielectric layer 23 and a stopper layer 25, the stopper layer 25 providing a stopping surface for a chemical-mechanical polishing process used in forming the ferroelectric body 17. In FIG. 3, the bottom electrode 13 is surrounded by another dielectric lining 26, which prevents the unwanted deposition of electrode material on the sides of the capacitor 11 during the fabrication process. The capacitor 11 is formed on a substrate 27, which may include transistors and other electronic circuit elements. In an integrated electronic device, the bottom electrode 13, for example, may extend perpendicular to the drawing sheet and be shared by a plurality of ferroelectric capacitors 11.

The ferroelectric body 17 has a bi-stable crystalline structure exhibiting spontaneous polarization. If an electric field of varying polarity is applied across the ferroelectric body 17 by controlling the voltages of the top and bottom electrodes, the polarization reverses and a hysteresis loop is observed, enabling the capacitor 11 to store one bit of information.

An exemplary fabrication process for the capacitor in FIG. 2 will be described next. The capacitors in FIGS. 1 and 3 can be fabricated by modifications of this process. Modifications for the fabrication of the capacitor 11 in FIG. 3 will be described later.

Figure 4:
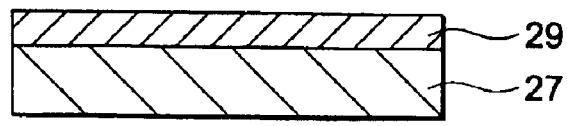
FIGS. 4, 5, 6, 7, 8, 9, 10, 11, 12, and 13 illustrate steps in the fabrication of the ferroelectric capacitor in FIG. 2.

Referring to FIG. 4, the first step in the fabrication process forms a bottom electrode film 29 on the substrate 27. In the present embodiment, the bottom electrode film 29 is a film of iridium oxide ($IrO_2$), which has the desirable property that it can be etched without the deposition of unwanted residue on the sidewalls of other layers. A bottom electrode film 29 of iridium oxide approximately two thousand angstroms (2000 Å) thick is formed by direct-current (dc) magnetron sputtering for one hundred eighty seconds (180 s) using a mixture of argon (Ar) gas with a flow rate of fourteen standard cubic centimeters per minute (14 sccm) and oxygen ($O_2$) gas with a flow rate of forty standard cubic centimeters per minute (40 sccm).

The invention is not limited to the use of iridium oxide for the bottom electrode. Various other conductive oxides may be employed, or a metal material in the family including platinum and iridium may be used.

Figure 5:
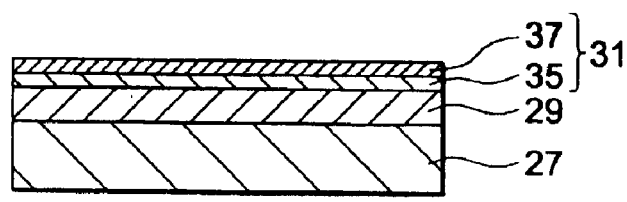

Referring to FIG. 5, the second fabrication step covers the bottom electrode film 29 with a dielectric film 31 comprising a dielectric layer 35, which is deposited on the bottom electrode film 29, and a stopper layer 37, which is deposited on the dielectric layer 35. The dielectric layer 35 is, for example, a silicon oxide (SiO) film approximately two thousand angstroms (2000 Å) thick, formed by chemical vapor deposition (CVD). The stopper layer 37 is, for example, a silicon nitride (SiN) film approximately one thousand angstroms (1000 Å) thick, also formed by CVD.

The stopper layer 37 may comprise any material having a slower polishing rate than the ferroelectric body material, thus capable of functioning as a stopper layer during chemical-mechanical polishing of the ferroelectric material. A conductive material may be used. For example, the stopper layer 37 may comprise the same material as the top electrode.

Silicon oxide is used for the dielectric layer 35 in the present embodiment because of its superior adhesion to the iridium-oxide bottom electrode film 29. If the bottom electrode film 29 is made of another material, however, the entire dielectric film 31 can be deposited as a single silicon-nitride film.

Figure 6:
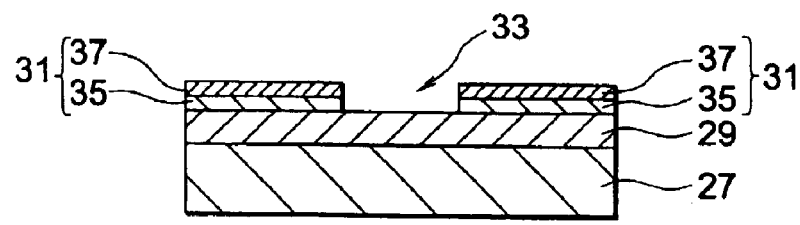

Referring to FIG. 6, the third fabrication step forms a hole 33 in the dielectric film 31, extending from the upper surface of the stopper layer 37 to the lower surface of the dielectric layer 35. The hole 33 is formed by conventional photolithography and etching.

Figure 7:
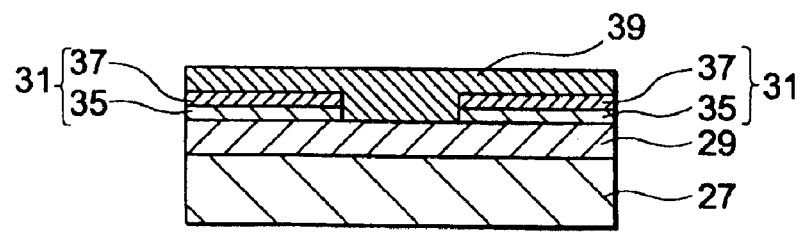

Referring to FIG. 7, the fourth fabrication step forms a ferroelectric film 39 covering the dielectric film 31 and filling the hole therein. The ferroelectric film 39 can be formed from any ferroelectric material; that is, any material exhibiting a polarization hysteresis loop. The present embodiment employs strontium bismuth tantalate ($SrBi_2Ta_2O_9$, also referred to as SBT). Examples of other usable ferroelectric materials include lead titanate zirconate, barium strontium titanate, and strontium bismuth tantalate niobate.

The ferroelectric film 39 is formed as follows. The constituent elements or precursors of the ferroelectric film 39 are first dissolved in an organic solvent to form a precursor solution. The following procedure is then repeated five times. (1) The precursor solution is spin-coated onto the surface of the stopper layer 37, including the interior surface of the hole. The spin-coating conditions are, for example, five hundred revolutions per minute (500 rpm) for twenty seconds, followed by two thousand revolutions per minute (2000 rpm) for five seconds. (2) After spin coating, the device is dried on a hot plate at a temperature of 150° C. for five minutes. (3) After drying, the device is annealed in an electric furnace at 450° C. for sixty minutes in an oxygen atmosphere. Five repetitions of this (1)–(2)–(3) procedure suffice to fill the hole in the dielectric film 31 with strontium bismuth tantalate material.

Figure 8:
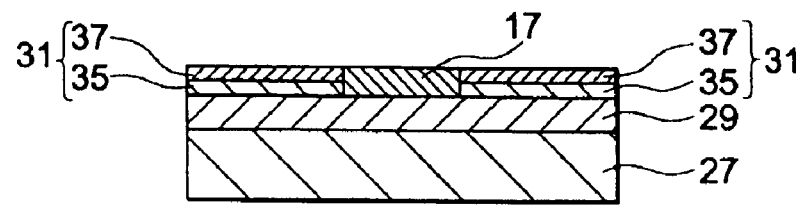

Referring to FIG. 8, the fifth fabrication step is a chemical-mechanical polishing (CMP) process that removes the ferroelectric film 39 down to the surface of the stopper layer 37, leaving the ferroelectric body 17 embedded in the hole in the dielectric film 31. This process is generally similar to the damascene process used in forming metal interconnection wiring in semiconductor integrated circuits, but employs a slurry of the type used for conventional polishing of oxide films. As one example, an ammonia-based slurry including silica particles can be used. Following chemical-mechanical polishing, the device is annealed again, to impart the desired crystalline structure to the ferroelectric body 17. For strontium bismuth tantalate, the crystalline structure can be formed by annealing at 800° C. for sixty minutes in a dry oxygen atmosphere.

Figure 9:
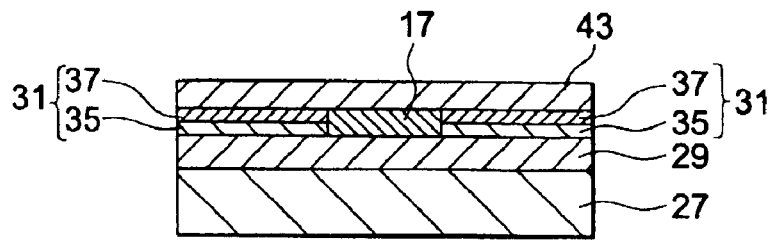

Referring to FIG. 9, the sixth fabrication step forms a top electrode film 43 covering the upper surface of the ferroelectric body 17 and stopper layer 37. In the present embodiment, the top electrode film 43 is an iridium oxide film approximately two thousand angstroms (2000 Å) thick, formed under the same conditions as the bottom electrode film 29.

The invention is not limited to the use of iridium oxide for the top electrode film 43; various other conductive materials may be employed. The top electrode and bottom electrode do not have to be made of the same material.

Figure 10:
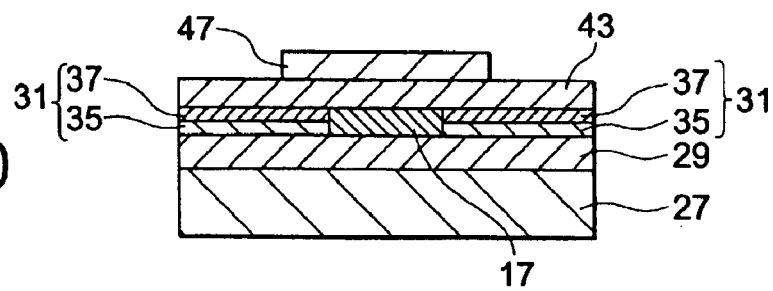
Figure 11:
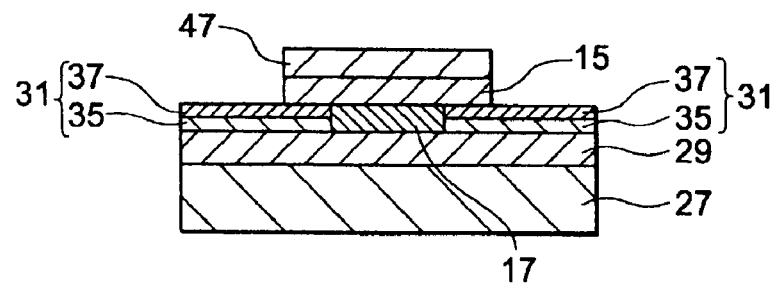

The seventh fabrication step removes part of the top electrode film 43 to form the top electrode 15. An etching mask 47 is formed as shown in FIG. 10, and the unmasked part of the top electrode film 43 is etched, leaving the top electrode 15 as shown in FIG. 11. There is no particular restriction on the type of etching mask used. The etching mask 47 can be formed by, for example, depositing a silicon oxide film on the top electrode film 43, coating this silicon oxide film with a resist, patterning the resist by photolithography, and etching the part of the silicon oxide film not protected by the resist pattern. The iridium-oxide top electrode film 43 can be etched in a parallel-plate reactive ion etching (RIE) apparatus using, for example, chlorine gas ($Cl_2$) at a 25-sccm flow rate and oxygen gas ($O_2$) at a 75-sccm flow rate, with an applied power of two hundred watts (200 W).

Figure 12:
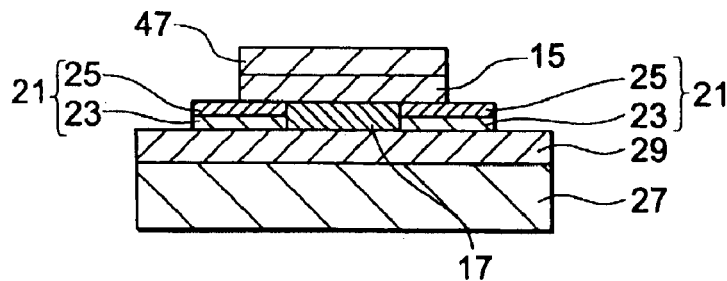

Referring to FIG. 12, the eighth fabrication step patterns the dielectric film 31 to form the dielectric lining 21. After the top electrode 15 has been formed in the seventh step, a resist pattern (not visible) covering at least the etching mask 47 is formed, and the part of the dielectric film 31 exposed by this resist pattern is removed by etching. Since the dielectric film 31 comprises a dielectric layer 35 and a stopper layer 37, the dielectric lining 21 likewise comprises a dielectric layer 23 and a stopper layer 25. At the end of the eighth step, the resist is removed, but the etching mask 47 is left for use in the next step.

Figure 13:
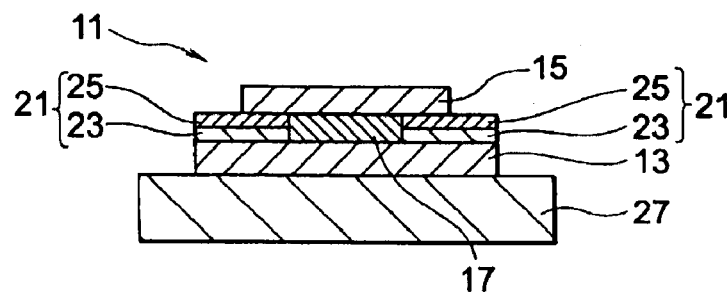

Referring to FIG. 13, the ninth fabrication step removes part of the bottom electrode film 29 to form the bottom electrode 13. The etching conditions described in the seventh step can be employed, the etching mask 47 now being supplemented by the stopper layer 25, which is also a silicon oxide film and functions as an etching mask. The etching process thus removes the part of the bottom electrode film 29 disposed exterior to the stopper layer 25. The bottom electrode 13 has the same width as the stopper layer 25. Since the bottom electrode film 29 comprises iridium oxide, this etching process does not leave a residue on the sidewalls of the dielectric lining 21.

Depending on the materials from which the top electrode film 43, stopper layer 37, dielectric layer 35, and bottom electrode film 29 are formed, the seventh, eighth, and ninth fabrication steps may be varied in several ways. For example, the etching processes in the seventh and eighth steps may use the same etching mask 47, if the dielectric film 31 comprises materials that can be selectively etched with respect to the etching mask 47. In the present embodiment, however, the stopper layer 37 and etching mask 47 are both silicon oxide films, so the dielectric film 31 must be etched with a separate mask.

If the same etching mask is used in the seventh and eighth steps, this mask may also be used to pattern the bottom electrode in the ninth step.

Alternatively, the etching mask 47 used in the seventh step may be removed at the end of the seventh step, and a new resist pattern covering at least the ferroelectric body 17 may be formed at the end of the eighth step, to protect the top electrode 15 while the bottom electrode film is etched.

If the bottom electrode film 29 comprises a material such as platinum or iridium, the etching mask 47 should be replaced by an etching mask covering both the top electrode 15 and the dielectric lining 21, to prevent the formation of a metallic residue on the sidewalls of the capacitor 11. Such a residue would allow current to leak between the bottom electrode 13 and top electrode 15. In this case, the bottom electrode 13 is wider than the stopper layer 25.

The process described above completes the formation of the capacitor 11 shown in FIG. 2. The widths of the bottom electrode 13, top electrode 15, and ferroelectric body 17 in the first embodiment are related as follows. The widths are widths in the horizontal direction in the drawings; that is, widths in the plane of the surface of the substrate 27, perpendicular to the direction in which the bottom electrode 13 extends in a multi-capacitor device.

The top electrode 15 is wider than the ferroelectric body 17. Consequently, the ferroelectric body 17 is not exposed to the etching process that patterns the top electrode film 43 to form the top electrode 15. The likelihood of damage to the ferroelectric body 17 is thereby reduced.

The bottom electrode 13 may be wider than the ferroelectric body 17, as shown in FIG. 2. In this case, the ferroelectric body 17 and the surrounding dielectric lining 21, including the dielectric layer 23 and stopper layer 25, are both disposed on the surface of the bottom electrode 13.

However, the bottom electrode 13 may also be narrower than the ferroelectric body 17, as shown in FIG. 3. In this case, the bottom electrode 13 is embedded in a dielectric lining 26, and the step that forms the bottom electrode from the bottom electrode film 29 (the ninth step in the description above) is performed between the first step and the second step, by chemical-mechanical polishing, for example. The dielectric lining 26 comprises, for example, a silicon oxide film similar to the dielectric layer 23, or a material that also functions as a stopper film for chemical-mechanical polishing. In FIG. 3, even if the bottom electrode 13 comprises a material that produces a sidewall residue, no problem of current leakage occurs, because the bottom electrode 13 is formed before the sidewalls of the ferroelectric body 17 and dielectric lining 21 are formed. The etching of the bottom electrode 13 takes place before the dielectric film 31 and ferroelectric film 39 are even present.

Although formation of the ferroelectric film 39 requires repeated annealing, the annealing temperature is comparatively low (450° C.). High-temperature annealing (800° C.) is necessary only once. Adverse effects on other process steps or circuit elements are thus reduced. Furthermore, the fabrication process is not delayed by repeated annealing steps to repair etching damage to the ferroelectric body 17.

Figure 14:
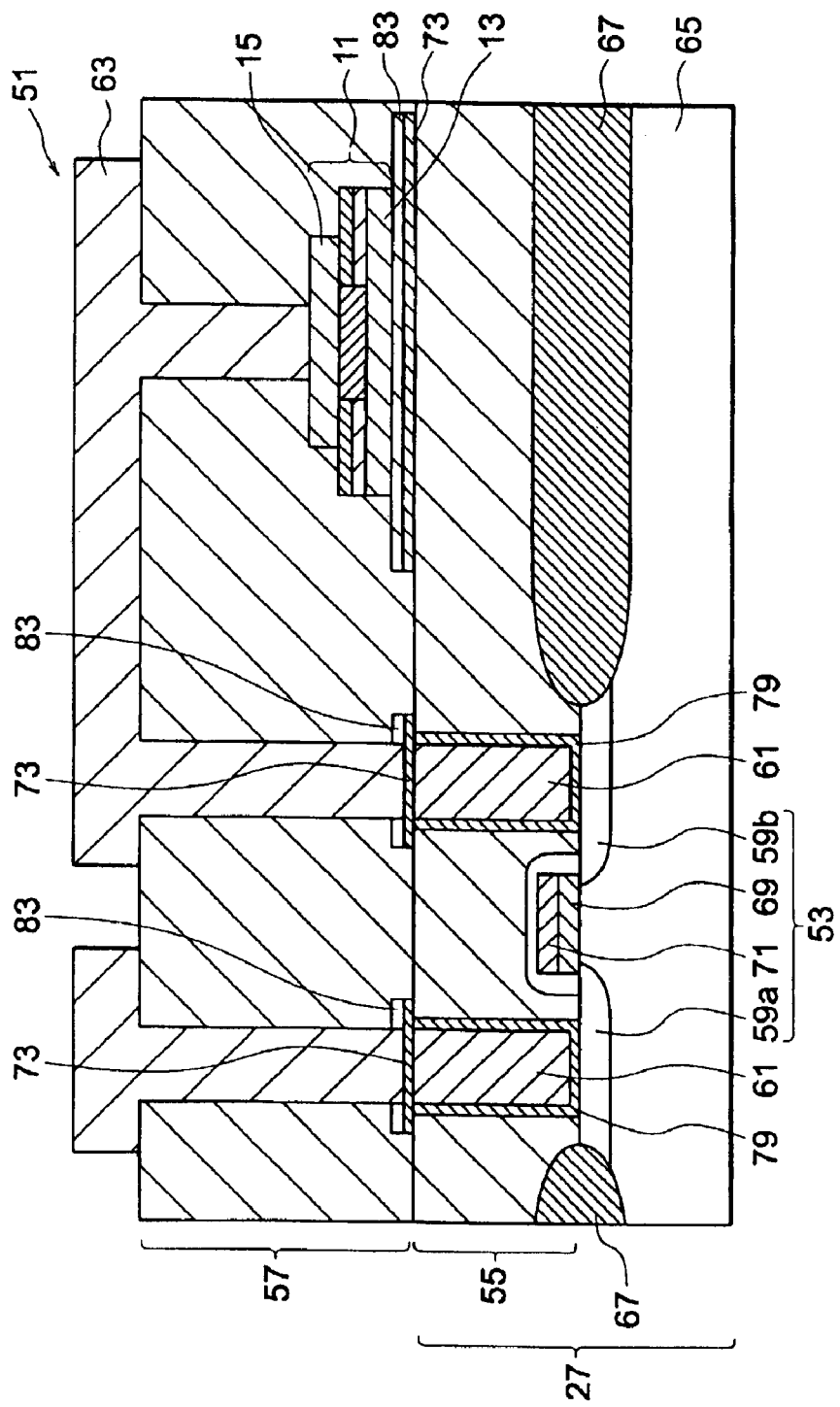
FIG. 14 is a sectional view of a planar memory cell embodying the invention.

As a second embodiment of the invention, FIG. 14 shows a planar type of memory cell employing the capacitor 11 described in the first embodiment.

The components of the planar memory cell 51 include at least one transistor 53, a first interlayer dielectric film 55 covering the transistor 53, a capacitor 11 disposed above the first interlayer dielectric film 55, and a second interlayer dielectric film 57 covering the capacitor 11 and first interlayer dielectric film 55. The source 59a or drain 59b of the transistor 53 is electrically coupled to the top electrode 15 of the capacitor 11 by a first conductor 61 extending vertically through the first interlayer dielectric film 55, and a second conductor 63 disposed on and within the second interlayer dielectric film 57. The transistor 53 is formed in a semiconductor substrate 65 and isolated from other elements by field oxide regions 67, as in conventional semiconductor devices. The substrate 65 comprises, for example, silicon (Si) doped with an impurity of one type, forming a p$^-$-Si semiconductor material, while the source and drain 59a and 59b of the transistor 53 are doped with an impurity of another type, forming n$^+$-Si semiconductor regions. The field oxide regions 67 comprise, for example, areas of silicon dioxide (SiO$_2$) formed by local oxidization of the surface of the semiconductor substrate 65.

The capacitor 11 in FIG. 14 has the structure shown in FIG. 2, but the structure shown in FIG. 1 or FIG. 3 may be used instead. The substrate 27 in FIGS. 1, 2, and 3 corresponds to the first interlayer dielectric film 55 and semiconductor substrate 65 in FIG. 14, including the transistor 53 and field oxide regions 67. The transistor 53 is shown as a metal-oxide-semiconductor field-effect transistor (MOSFET) having a gate oxide 69 and a gate electrode 71, but another type of transistor can be used instead. In a classical MOSFET, the gate oxide 69 is silicon dioxide and the gate electrode 71 is metal, but the gate electrode 71 may comprise polysilicon instead of metal.

The planar memory cell 51 also has a third conductor 73 (generally referred to as dot metal) disposed in certain locations at the interface between the first and second interlayer dielectric films 55, 57 to ensure electrical continuity between the first conductor 61 and second conductor 63. In plan view, the third conductor 73 would appear to comprise a plurality of dots, each exceeding the width of the corresponding parts of the first conductor 61 and second conductor 63, thereby compensating for mask misalignment between the masks defining the first conductor 61 and second conductor 63 during the fabrication process.

An exemplary fabrication process for this planar memory cell 51 will be described next.

Figure 15:
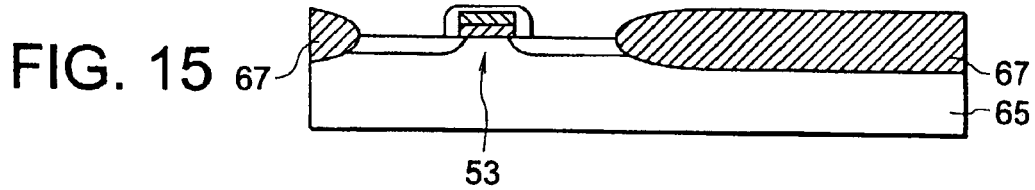
FIGS. 15, 16, 17, 18, 19, 20, 21, 22, 23, 24, 25, and 26 illustrate steps in the fabrication of the memory cell in FIG. 14.
Figure 16:
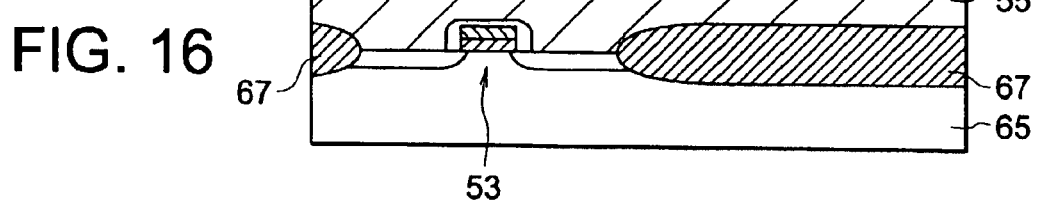
Figure 17:
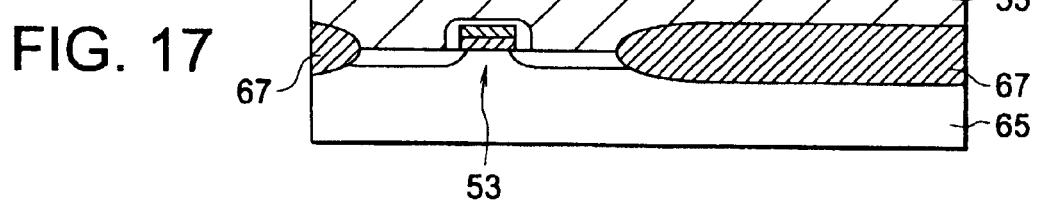

Referring to FIG. 15, the process starts from a semiconductor substrate 65 in which at least the transistor 53 and field oxide regions 67 have already been formed. The first fabrication step, shown in FIG. 16, covers the semiconductor substrate 65 with the first interlayer dielectric film 55. The first interlayer dielectric film 55 is, for example, deposited by CVD to a thickness of ten thousand angstroms (10,000 Å) The first fabrication step preferably includes planarization of the surface of the first interlayer dielectric film 55, as shown in FIG. 17, to eliminate height variations globally and provide a flat surface on which to form the capacitor 11. Planarization can be carried out by the following etch-back process. First, the surface of the first interlayer dielectric film 55 is covered with a layer of silicon oxide five thousand angstroms (5000 Å) thick, applied by spin coating as a film of spin-on glass (SOG). This SOG film itself has a substantially flat surface. Next, the SOG film and the first interlayer dielectric film 55 are etched back, removing a combined thickness of material exceeding the thickness of the SOG film (a combined thickness of 7000 Å, for example), so that none of the SOG film is left. The remaining surface of the first interlayer dielectric film 55 is substantially flat.

One beneficial result of planarization is that when the ferroelectric body 17 in the capacitor 11 is formed by chemical-mechanical polishing, excess material is not left on the surface of the ferroelectric body 17.

Figure 18:
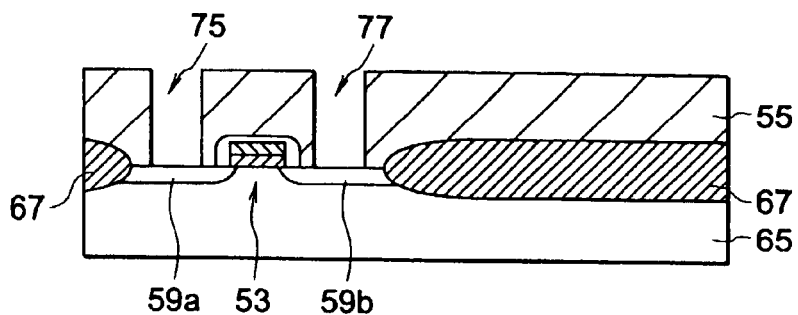

Referring to FIG. 18, the second fabrication step forms contact holes 75, 77 leading from the surface of the first interlayer dielectric film 55 to the source 59a and drain 59b of the transistor 53. These contact holes 75, 77 can be formed by conventional photolithography and etching.

Figure 19:
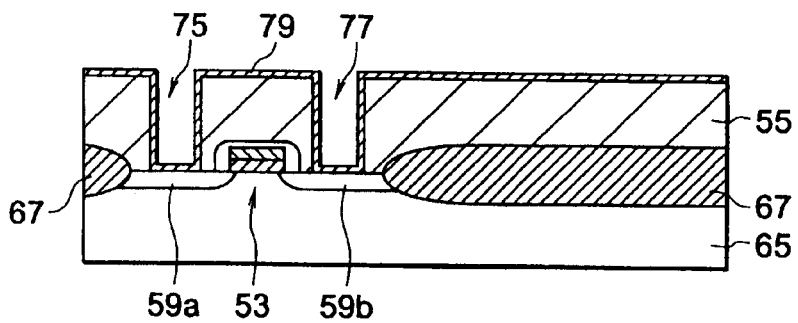

Referring to FIG. 19, the third fabrication step coats the surface of the first interlayer dielectric film 55, including the interior surfaces in the contact holes 75, 77, with a protective film 79 of, for example, titanium nitride (TiN). The purpose of this protective film 79 is to prevent the material forming the source 59a and drain 59b of the transistor 53 from reacting with the first conductor during heat treatment in later fabrication steps. A protective film of titanium nitride can be formed by, for example, depositing a titanium film on the surface of the first interlayer dielectric film 55, including the inside walls of the contact holes 75, 77 and the exposed surfaces of the source 59a and drain 59b, then heating the titanium film in a nitrogen atmosphere for thirty seconds at 760° C.

Figure 20:
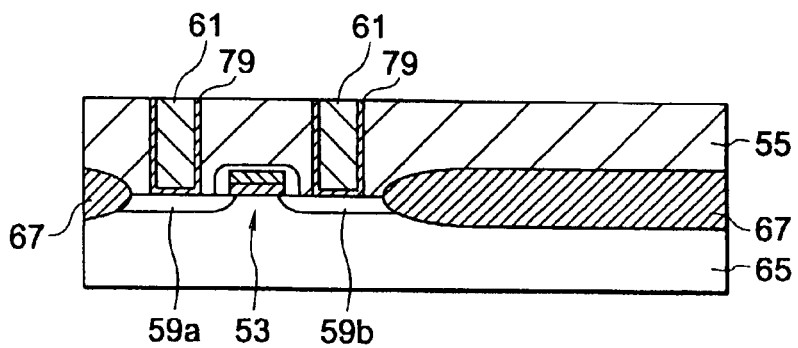

Referring to FIG. 20, the fourth fabrication step forms the first conductor 61 in the contact holes 75, 77. The first conductor 61 may be formed from tungsten, or from any other suitable conductive material. The fourth step is carried out, for example, as follows. First, a layer of the material constituting the first conductor 61 is deposited on the surface of the first interlayer dielectric film 55, more precisely on the surface of the protective film 79, filling the interiors of the contact holes 75, 77. Next, this layer is etched back, removing both the deposited conductor material and the protective film 79 from the surface of the first interlayer dielectric film 55, where they are not needed, and leaving the first conductor 61 present as plugs embedded in the contact holes 75, 77.

Figure 21:
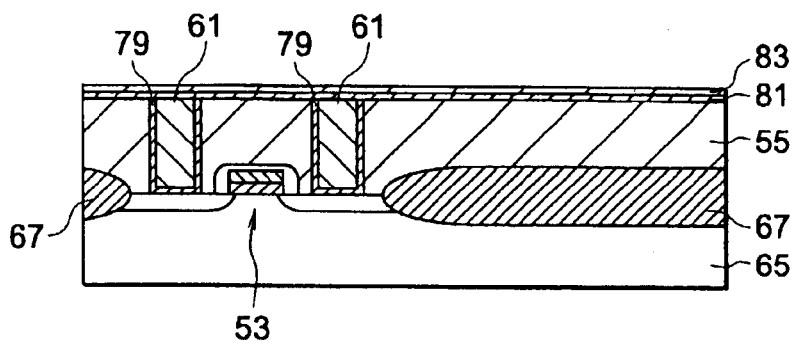

Referring to FIG. 21, the fifth fabrication step forms a conductive film 81 covering the surface of the first interlayer dielectric film 55, including the exposed surfaces of the first conductor 61, and a third interlayer dielectric film 83 covering the conductive film 81. The conductive film 81 can be formed from any conductive material: for example, from titanium nitride. The third interlayer dielectric film 83 is, for example, a silicon oxide film two thousand angstroms (2000 Å) thick.

Figure 22:
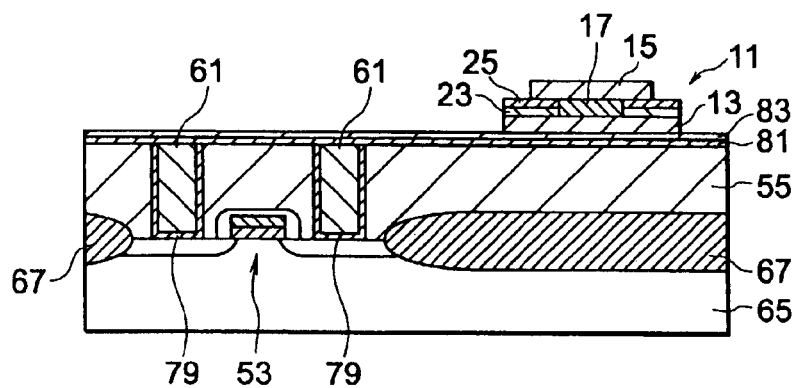

Referring to FIG. 22, the sixth fabrication step forms the capacitor 11 on the surface of the first interlayer dielectric film 55, more precisely, on the surface of the third interlayer dielectric film 83, by the process described in the first embodiment. The bottom electrode 13 and top electrode 15 preferably comprise iridium oxide, to avoid leaving sidewall residues, and to avoid leaving residues on the surface of the third interlayer dielectric film 83.

Figure 23:
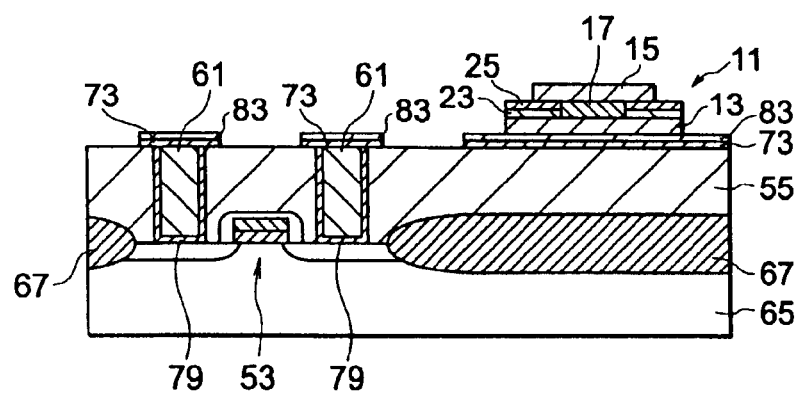

Referring to FIG. 23, the seventh fabrication step patterns the conductive film 81 and third interlayer dielectric film 83, by photolithography and etching, for example, leaving the third conductor 73 present as a pair of dots over the contact holes 75, 77. As noted above, the third conductor dots are wider than the contact holes 75, 77. The third interlayer dielectric film 83 insulates the third conductor 73 and the bottom electrode 13 of the capacitor 11 from one another. The third interlayer dielectric film 83 does not have to cover all parts of the third conductor 73, provided it covers the part disposed below the bottom electrode 13.

Figure 24:
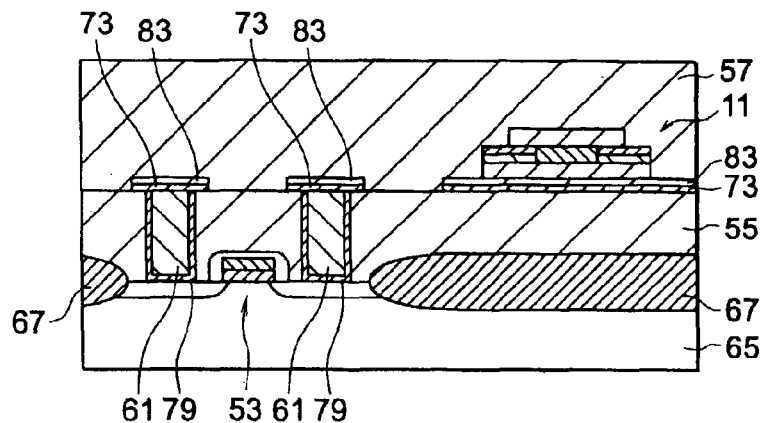

Referring to FIG. 24, the eighth fabrication step forms the second interlayer dielectric film 57 over the first interlayer dielectric film 55 and capacitor 11. The second interlayer dielectric film 57 is, for example, a silicon oxide film eight thousand angstroms (8000 Å) thick, formed as was the first interlayer dielectric film 55. The surface of the second interlayer dielectric film 57 is preferably planarized by being etched back in the same way that the first interlayer dielectric film 55 was planarized, to provide a flat surface for subsequent photolithography.

Figure 25:
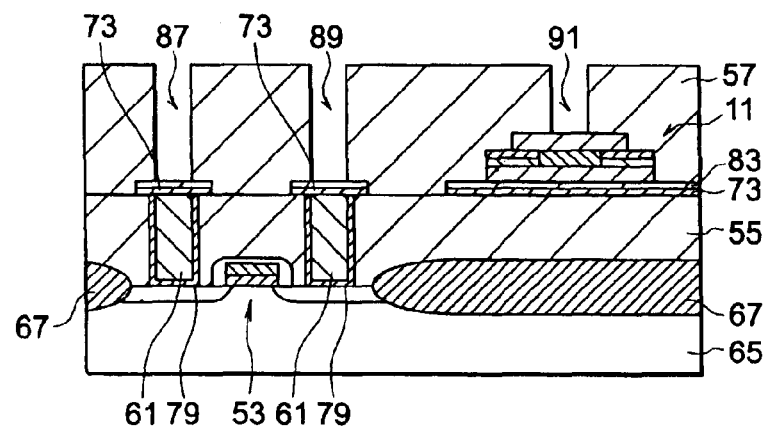

Referring to FIG. 25, the ninth fabrication step forms contact holes 87, 89 extending vertically through the second interlayer dielectric film 57, aligned with the contact holes 75, 77 in the first interlayer dielectric film 55, and a contact hole 91 extending from the surface of the second interlayer dielectric film 57 down to the top electrode of the capacitor 11. These contact holes may be formed by photolithography and etching, preferably in two separate etching steps, using one etching mask for the first two contact holes 87, 89, and another etching mask for the third contact hole 91, to prevent unnecessary damage to the top electrode of the capacitor 11.

Figure 26:
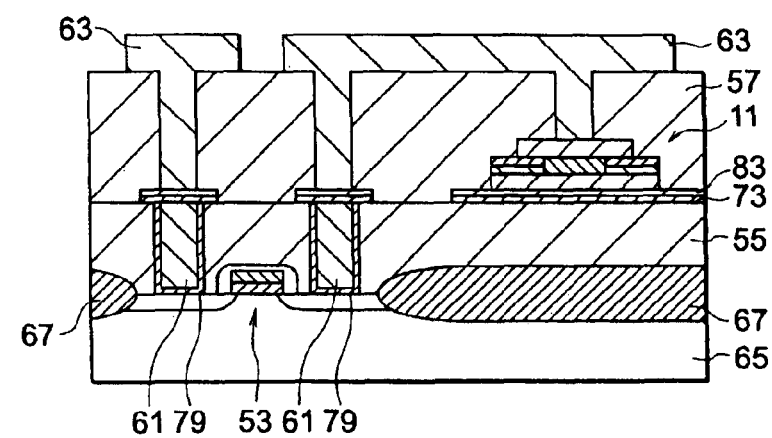

Referring to FIG. 26, the tenth fabrication step deposits and patterns the second conductor 63, so that the second conductor 63 fills the contact holes 87, 89, 91 in the second interlayer dielectric film 57 and forms an electrical connection between the last two of these contact holes 89, 91. The second conductor 63 comprises, for example, aluminum, which can be deposited and patterned by well-known methods.

Additional steps may be carried out to add further wiring interconnection layers or a surface passivation film. Descriptions of these conventional steps will be omitted.

During the capacitor fabrication process in the sixth step above, the ferroelectric film and ferroelectric body 17 are repeatedly annealed, but only the final annealing process, after chemical-mechanical polishing, is carried out at a high temperature. Compared with the prior art, in which high-temperature annealing is repeatedly necessary, effects on the electrical characteristics of the transistor 53 are significantly reduced.

Figure 27:
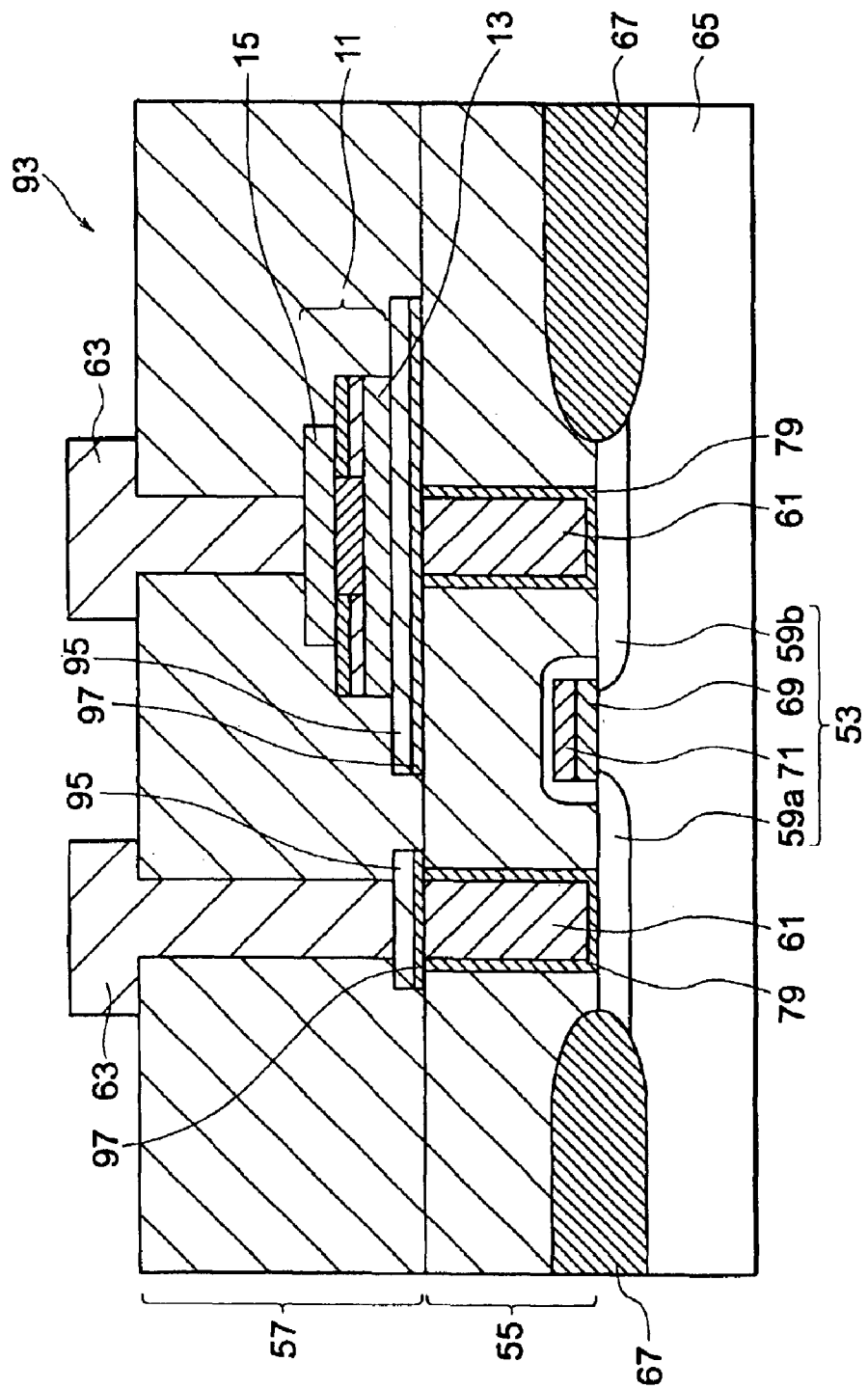
FIG. 27 is a sectional view of a stacked memory cell embodying the invention.

As a third embodiment of the invention, FIG. 27 shows a stacked type of memory cell employing the capacitor 11 described in the first embodiment.

The components of the third embodiment include a transistor 53 formed in a semiconductor substrate 65, a first interlayer dielectric film 55, a second interlayer dielectric film 57, and a capacitor 11 as described in the second embodiment, the capacitor 11 now being disposed on the first interlayer dielectric film 55 above the transistor 53. A first conductor 61 and second conductor 63 are formed in contact holes in the first and second interlayer dielectric films 55, 57. The bottom electrode 13 of the capacitor 11 is electrically coupled to an electrode of the transistor 53, e.g. the drain electrode 59b, by a plug of the first conductor 61. To prevent chemical reactions between the bottom electrode 13 and first conductor 61, the third embodiment provides a barrier layer 95 at the interface between them. To prevent the barrier layer 95 from becoming detached from the first conductor 61, an adhesion layer 97 is provided between the barrier layer 95 and first conductor 61, completing the structure of the stacked memory cell 93.

The transistor 53 is shown as a MOSFET and the capacitor 11 is shown as having the structure in FIG. 2, but the third embodiment is not limited to these particular structures.

Next, an exemplary process for fabricating the stacked memory cell 93 will be described. This process begins with the first four steps described in the second embodiment, producing the structure shown in FIG. 20, in which the contact holes 75, 77 in the first interlayer dielectric film 55 are filled with plugs of the first conductor 61.

Figure 28:
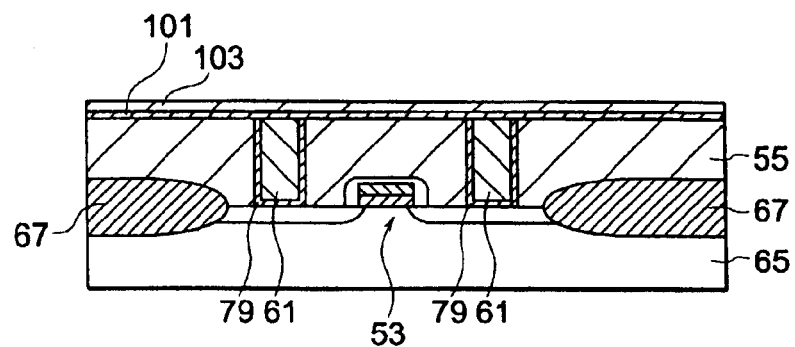

Referring to FIG. 28, the fifth fabrication step in the third embodiment forms an adhesion film 101 and a barrier film 103 on the surface of the first interlayer dielectric film 55, including the surface of the first conductor plugs. The adhesion film 101 is, for example, a titanium nitride film one thousand angstroms (1000 Å) thick. The barrier film 103 is, for example, an iridium film one thousand angstroms (1000 Å) thick, formed on the adhesion film 101 by dc magnetron sputtering. The adhesion film 101 provides improved adhesion between the first interlayer dielectric film 55 and barrier film 103.

Figure 29:
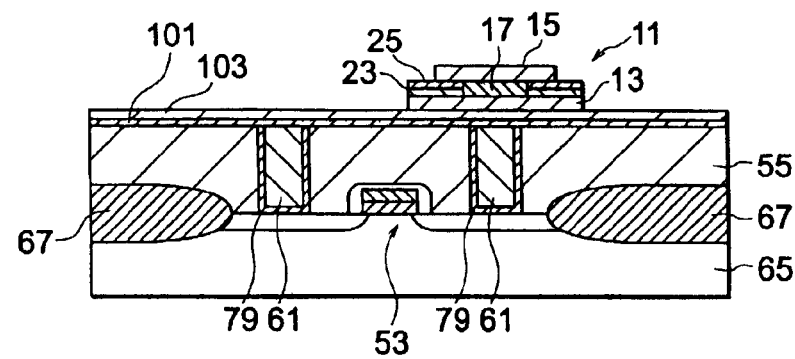

Referring to FIG. 29, the sixth fabrication step forms the capacitor 11 on the barrier film 103, over one of the two contact holes in the first interlayer dielectric film 55. The capacitor 11 can be formed by the process described in the first embodiment. As in the second embodiment, the electrodes 13, 15 of the capacitor 11 preferably comprise iridium oxide, and strontium bismuth tantalate can be used as the ferroelectric body 17. If the bottom electrode 13 comprises iridium oxide and the barrier film 103 comprises iridium, both films can be etched under the etching conditions normally used for iridium oxide.

Figure 30:
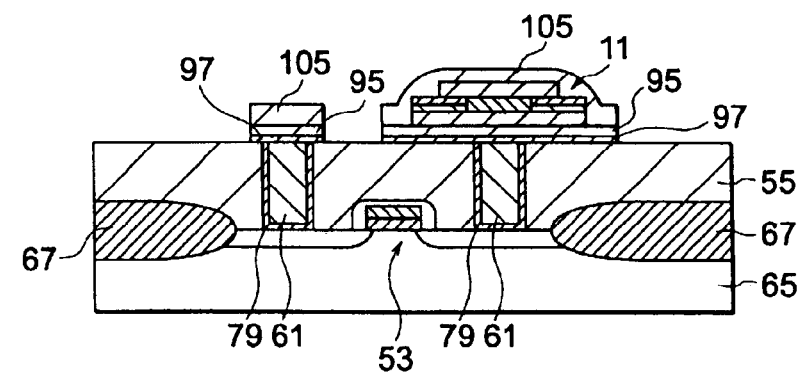

Referring to FIG. 30, the seventh fabrication step forms an etching mask 105 covering at least the capacitor 11, and removes the part of the barrier film 103 and adhesion film 101 not covered by the etching mask to form the barrier layer 95 and adhesion layer 97. The etching mask 105 may also cover the part of the barrier film 103 disposed over the contact hole not covered by the capacitor 11, leaving a dot of the barrier layer 95 at this location. This dot has the same function as the dot of the third conductor 73 in the second embodiment.

The etching mask 105 is formed by patterning of, for example, a silicon oxide film three thousand angstroms (3000 Å) thick. The etching mask 105 can be left in place to become part of the second interlayer dielectric film 57. The etching mask 105 prevents the formation of sidewall residues on the capacitor 11, even if the barrier film 103 comprises a material such as iridium that would form residues if the capacitor 11 were unprotected.

Iridium is not an easy material to etch, but the iridium barrier film 103 can be etched by an ion milling technique, using chlorine ($Cl_2$) at a 25-sccm flow rate and argon (Ar) at a 75-sccm flow rate.

Referring to FIG. 31, the eighth fabrication step forms the second interlayer dielectric film 57, covering the first interlayer dielectric film 55 and capacitor 11. This step can be carried out as described in the second embodiment, preferably including planarization of the second interlayer dielectric film.

Referring to FIG. 32, the ninth fabrication step forms contact holes 87, 89 in the second interlayer dielectric film 57. Contact hole 87 extends to the barrier dot 95 disposed above the plug of the first conductor 61 in the first contact hole in the first interlayer dielectric film 55. Contact hole 89 extends to the top electrode 15 of the capacitor 11. The two contact holes 87, 89 may be formed in two separate etching steps, using different etching masks, to avoid unnecessary damage to the top electrode 15.

Referring to FIG. 33, the tenth fabrication step deposits and patterns the second conductor 63, filling in both contact holes 87, 89 in the second interlayer dielectric film 57, thereby completing the stacked memory cell 93.

As in the second embodiment, the fabrication process includes only one high-temperature annealing step during the formation of the capacitor 11, so thermal effects on the electrical characteristics of the transistor 53 are reduced, as compared with the prior art.

As a fourth embodiment of the invention, FIG. 34 shows another stacked memory cell 93. In this stacked memory cell 93, the barrier layer 95 disposed at the interface between the bottom electrode 13 of the capacitor 11 and the first conductor 61 is surrounded by a dielectric layer 99 and a stopper layer 107. The central part of the bottom electrode 13 rests on the barrier layer 95; the peripheral part of the bottom electrode 13 rests on the stopper layer 107. The dielectric layer 99 is disposed between the stopper layer 107 and adhesion layer 97.

The transistor 53 is shown as a MOSFET and the capacitor 11 is shown as having the structure in FIG. 2, but the fourth embodiment is not limited to these particular structures.

Next, an exemplary process for fabricating the stacked memory cell 93 in the fourth embodiment will be described. This process begins with the same first four steps as in the second and third embodiments, producing the structure shown in FIG. 20.

Figure 35:
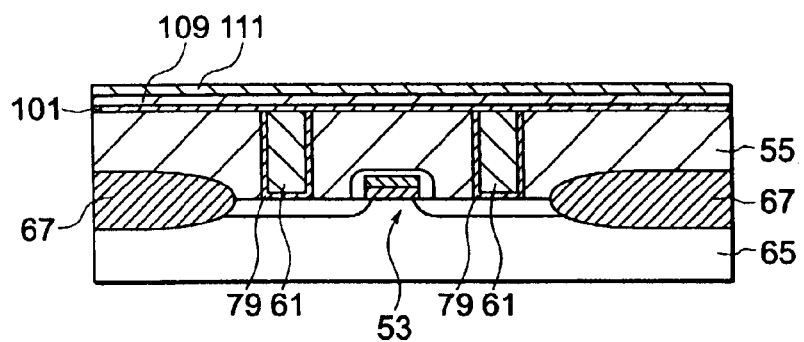
FIGS. 35, 36, 37, 38, 39, 40, 41, 42, and 43 illustrate steps in the fabrication of the memory cell in FIG. 34.

Referring to FIG. 35, the fifth fabrication step in the fourth embodiment forms the adhesion film 101 described in the third embodiment, and a dielectric film 109 and stopper film 111. The dielectric film 109 is, for example, a silicon oxide film one thousand angstroms (1000 Å) thick. The stopper film 111 is, for example, a silicon nitride film five hundred angstroms (500 Å) thick. If an iridium barrier material will be used, then the adhesion film 101 is, for example, a titanium nitride film one thousand angstroms (1000 Å) thick.

Figure 36:
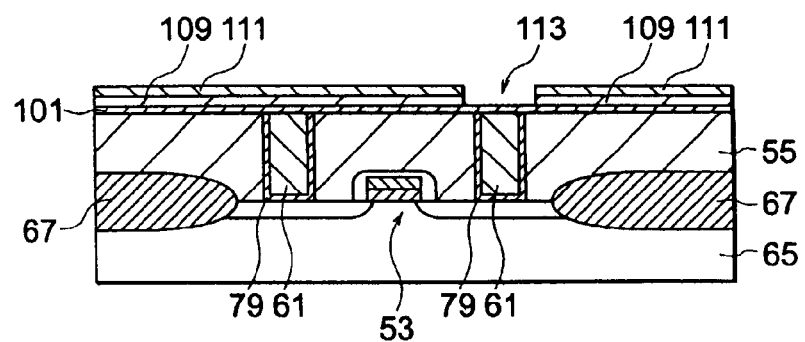

Referring to FIG. 36, the sixth fabrication step patterns the dielectric film 109 and stopper film 111 to form a hole 113 extending down to the upper surface of the adhesion film 101. This hole 113 can be formed by conventional photolithography and etching. The hole 113 is disposed over the first conductor plug 61 in the area where the capacitor 11 will be formed later.

Figure 37:
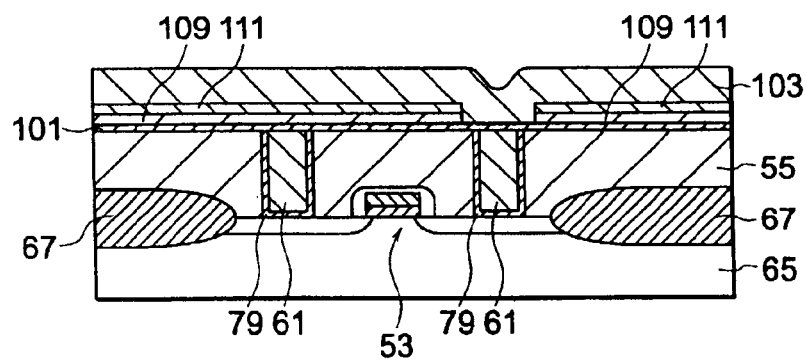

Referring to FIG. 37, the seventh fabrication step forms the barrier film 103, covering the stopper film 111 and filling in the hole 113. The barrier film 103 must be thicker than the depth of the hole 113. The barrier film 103 is, for example, an iridium film three thousand angstroms (3000 Å) thick, formed by dc magnetron sputtering.

Figure 38:
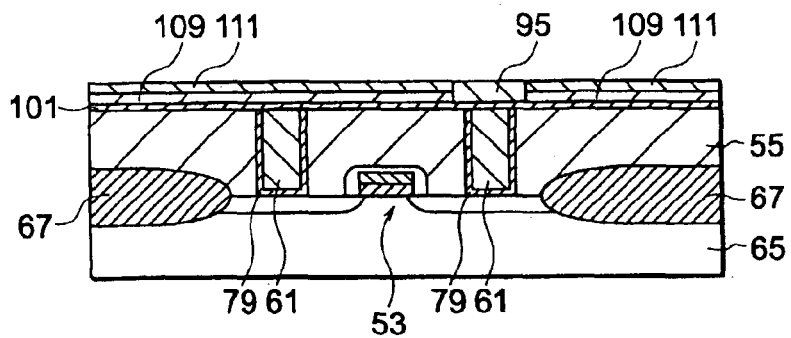

Referring to FIG. 38, the eighth fabrication step is a chemical-mechanical polishing step that removes the barrier film 103 down to the surface of the stopper film 111, leaving a barrier layer 95 embedded in the hole in the dielectric film 109 and stopper film 111. Compared with the etching or milling process used to form the barrier layer 95 in the third embodiment, chemical-mechanical polishing of iridium is relatively easy.

Figure 39:
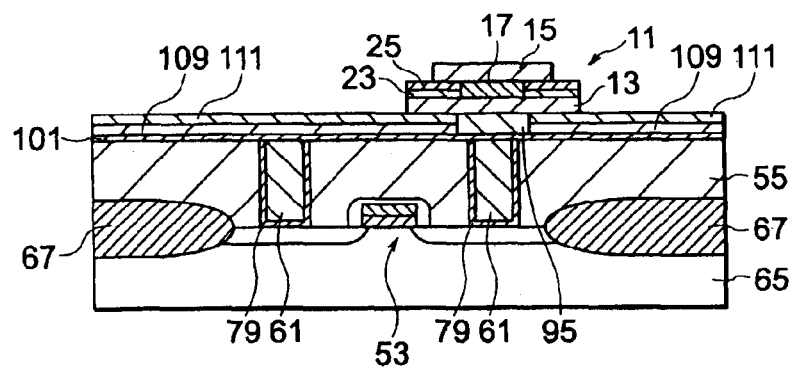

Referring to FIG. 39, the ninth fabrication step forms the capacitor 11 by the process described in the first embodiment. The bottom electrode 13 of the capacitor 11 makes electrical contact with the barrier layer 95, which is electrically coupled through the adhesion film 101, the first conductor 61, and the protective film 79 to the transistor 53. As in the second embodiment, the bottom electrode 13 and top electrode 15 preferably comprise iridium oxide, and the ferroelectric body 17 may comprise strontium bismuth tantalate.

Figure 40:
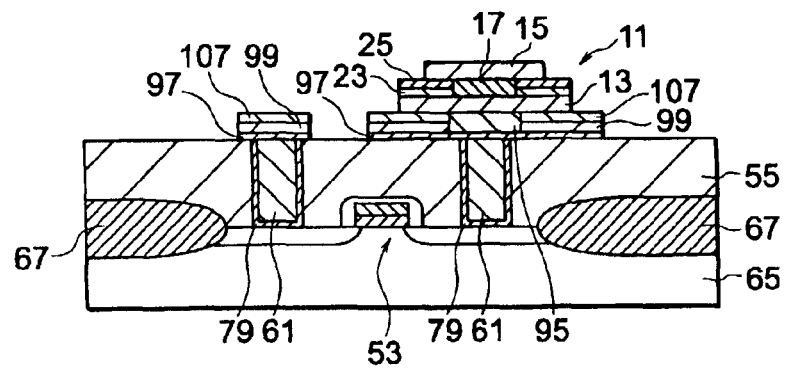

Referring to FIG. 40, the tenth fabrication step etches the adhesion film, dielectric film, and stopper film, using an etching mask (not visible) that covers at least the capacitor 11, to leave an adhesion layer 97, dielectric layer 99, and stopper layer 107 disposed at least below the capacitor 11. The etching mask may also protect the area above the contact hole not covered by the capacitor 11, so that the adhesion layer 97, dielectric layer 99, and stopper layer 107 remain present in this area too, as shown, the adhesion layer 97 performing the same misalignment compensation function as the third conductor dot 73 in the second embodiment.

Figure 41:
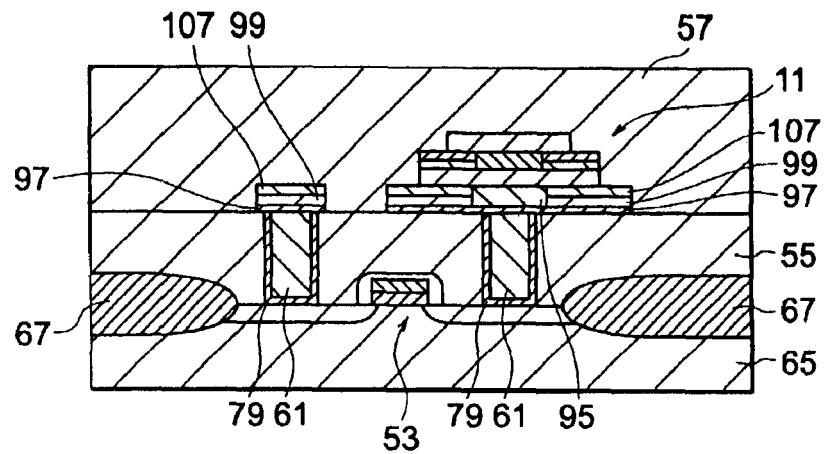

Referring to FIG. 41, the eleventh fabrication step forms the second interlayer dielectric film 57, covering the first interlayer dielectric film 55 and capacitor 11, as described in the second and third embodiments, preferably including planarization of the surface of the second interlayer dielectric film.

Figure 42:
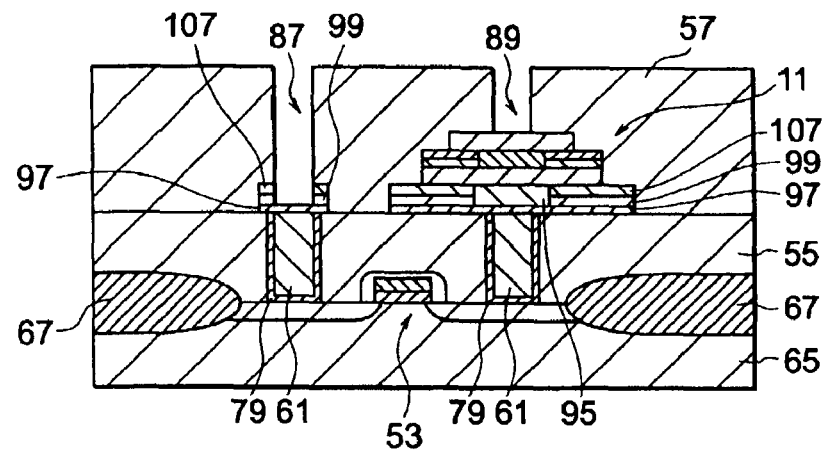

Referring to FIG. 42, the twelfth fabrication step forms contact holes 87, 89 in the second interlayer dielectric film 57, substantially as described in the third embodiment. The first contact hole 87 extends from the surface of the second interlayer dielectric film 57 through the stopper layer 107 and dielectric layer 99 down to the adhesion layer 97. The two contact holes 87, 89 may be formed in two etching steps with different etching masks.

Figure 43:
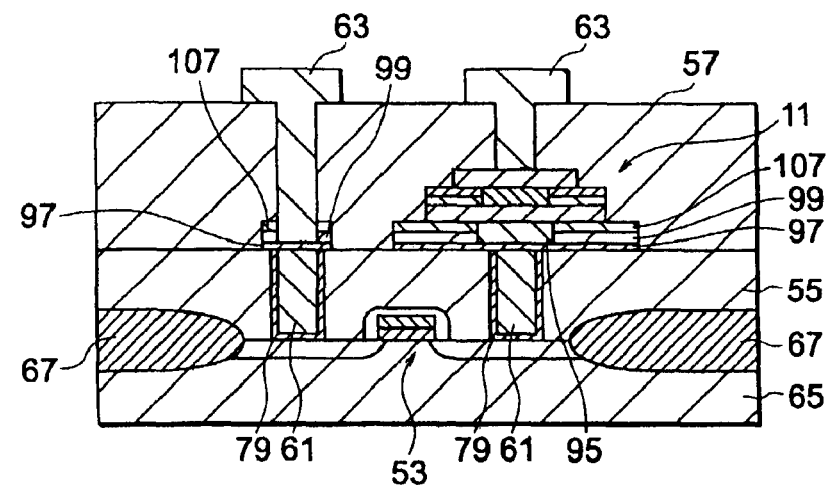

Referring to FIG. 43, the thirteenth fabrication step forms the second conductor 63 as described in the third embodiment, thereby completing the stacked memory cell 93.

The fourth embodiment provides substantially the same effects as the third embodiment, without the need to etch the barrier layer.

Figure 44:
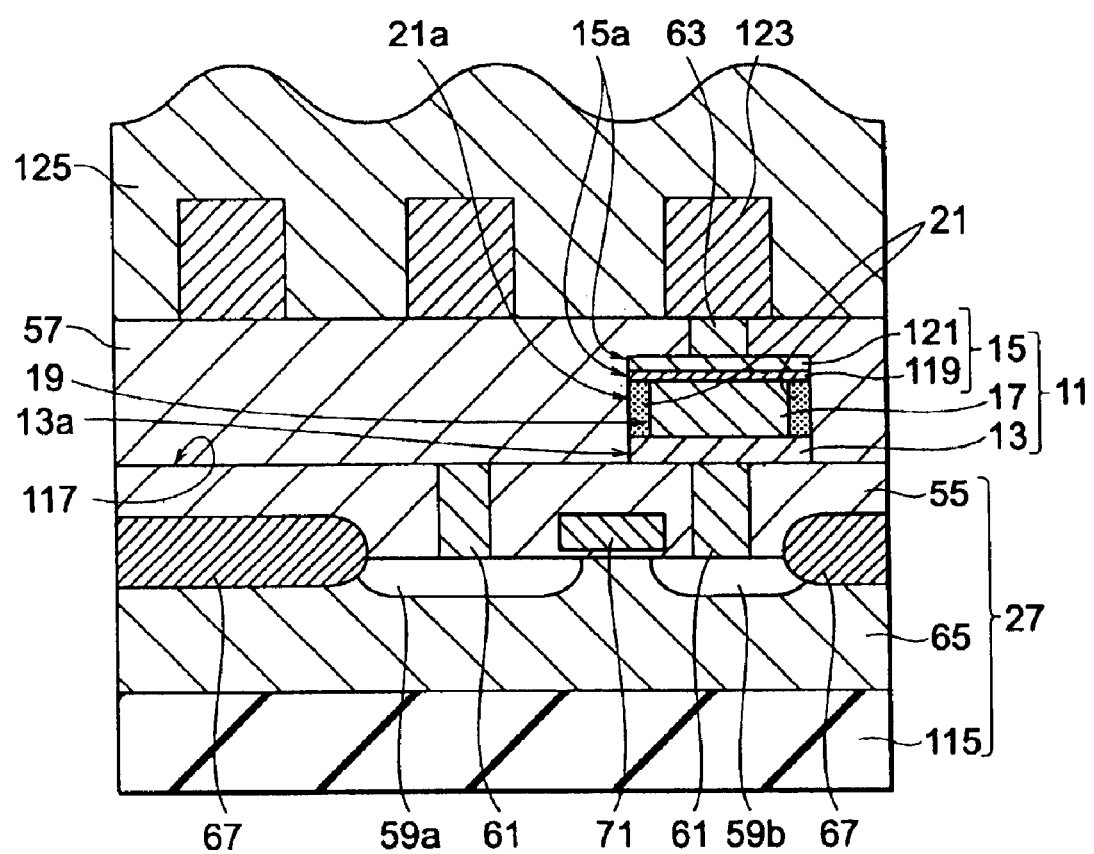
FIG. 44 is a sectional view of another stacked memory cell embodying the invention.

As a fifth embodiment of the invention, FIG. 44 shows still another stacked memory cell 93. The capacitor 11 in this stacked memory cell 93 has a slightly different structure from the ferroelectric capacitors described in the preceding embodiments.

FIG. 44 also shows certain elements that were not shown in the preceding drawings. For example, beneath the semiconductor substrate 65, which comprises silicon doped with a p-type impurity, there is a further silicon substrate 115 that is not doped. The first interlayer dielectric film 55, semiconductor substrate 65, and silicon substrate 115 constitute the substrate 27 on which the capacitor 11 is formed. The capacitor 11 is formed on the surface 117 of the substrate 27.

The bottom electrode 13 of the capacitor 11 comprises iridium oxide. The top electrode 15 has an iridium-oxide lower layer 119 and a titanium-nitride upper layer 121. The pattern edge 15a of the top electrode 15 is aligned with the pattern edge 13a of the bottom electrode 13. That is, the edges of the iridium-oxide and titanium-nitride patterns are all aligned. The ferroelectric body 17 comprises strontium bismuth tantalate, its pattern edge 19 being disposed inward of the pattern edges 13a and 15a of the top and bottom electrodes. The dielectric lining 21 comprises a material such as silicon dioxide, silicon nitride (SiN), or silicon oxynitride (SiON) filling the space left between the bottom electrode 13 and top electrode 15 that is not occupied by the ferroelectric body 17. The sides 19 of the ferroelectric body 17 and the sides 21a of the dielectric lining 21 are both substantially vertical. The sides 21a of the dielectric lining 21 are aligned with the pattern edges 13a, 15a of the top and bottom electrodes.

Seen in plan view, the bottom electrode 13 and the top electrode 15 are both larger than the ferroelectric body 17. An advantage of this geometry is that the electric field applied to the ferroelectric body 17 is substantially uniform.

The top electrode 15 is coupled by the second conductor 63 to a wiring pattern 123 extending in a direction perpendicular, for example, to the drawing sheet. The wiring pattern 123 is protected by a surface passivation layer 125. Although not shown in the drawing, the source 59a of the transistor may also be connected to the wiring pattern 123, as in the preceding embodiments.

Next, an exemplary fabrication process for the fifth embodiment will be described. The first four steps, which complete the substrate 27 on which the capacitor 11 will be formed, are the same as in the second, third, and fourth embodiments. The following drawings will show only the upper portion of the substrate 27, including part of the first interlayer dielectric film and first conductor.

Figure 45:
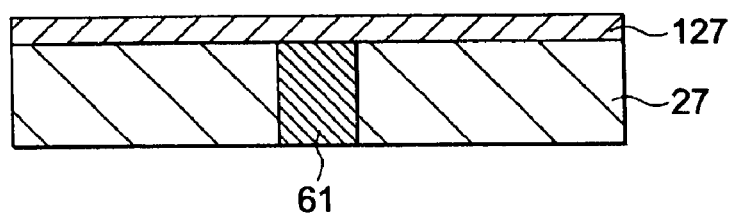
FIGS. 45, 46, 47, 48, 49, 50, 51, 52, and 53 illustrate steps in the fabrication of the memory cell in FIG. 44.

Referring to FIG. 45, the fifth fabrication step deposits a first conductive film 127 on the surface of the substrate 27. This film, which will be patterned to form the bottom electrode 13, is a sputtered film of iridium oxide one thousand angstroms (1000 Å) thick.

Figure 46:
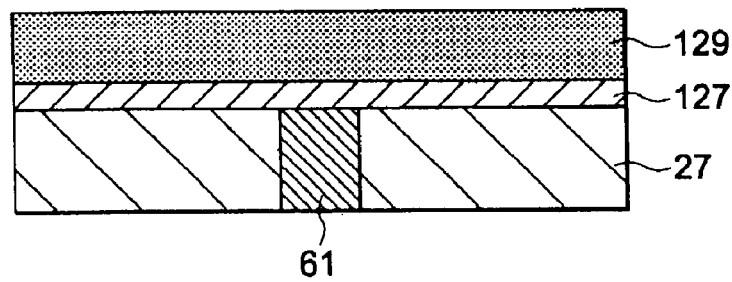

Referring to FIG. 46, the sixth fabrication step deposits a dielectric film 129 comprising, for example, silicon dioxide, silicon nitride, or silicon oxynitride, on the first conductive film 127. The dielectric film 129 is formed by CVD and is two thousand angstroms (2000 Å) thick.

Figure 47:
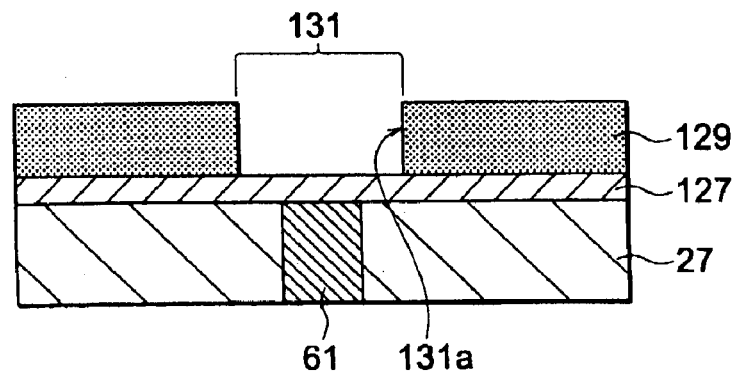

Referring to FIG. 47, the seventh fabrication step patterns the dielectric film 129 by photolithography and dry etching to form a hole 131 exposing part of the first conductive film 127. The sides 131a of the hole 131 are substantially vertical. The aspect ratio of the hole 131 is at least unity; that is the width-to-depth ratio of the hole 131 is at least 1:1.

Figure 48:
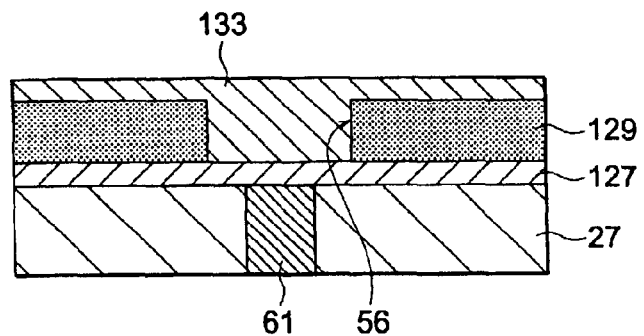

Referring to FIG. 48, the eighth fabrication step covers the surface of the dielectric film 129 and fills the hole 131 with a ferroelectric film 133 of strontium bismuth tantalate. The ferroelectric film 133 is applied by the sol-gel method. Since the width of the hole 131 is equal to or greater than its depth, the ferroelectric film 133 fills the hole 131 completely. Since the sides of the hole 131 are vertical, the pattern edge of the ferroelectric film 133 in the hole 131 is also vertical. The ferroelectric film 133 is then annealed in an oxygen atmosphere at 450° C. for one hour.

Figure 49:
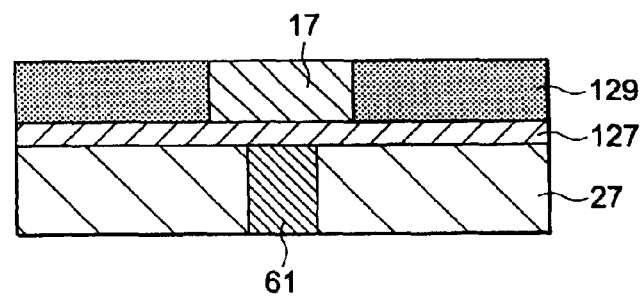

Referring to FIG. 49, the ninth fabrication step partly removes the ferroelectric film by chemical-mechanical polishing, using an ammonia-based slurry including silica particles, for example. The ferroelectric film is removed down to the surface of the dielectric film 129, forming the ferroelectric body 17. Following chemical-mechanical polishing, the ferroelectric body 17 is annealed at 750° C. for sixty minutes in an oxygen atmosphere.

Figure 50:
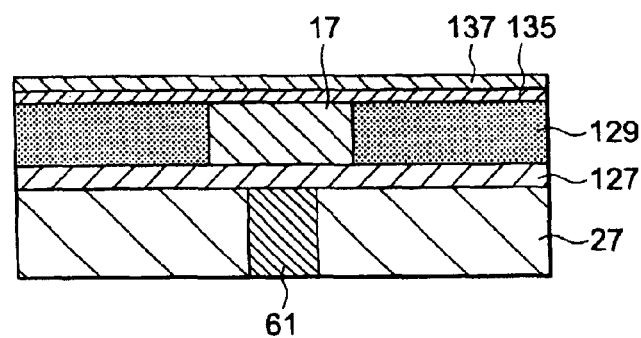

Referring to FIG. 50, the tenth fabrication step deposits a second conductive film on the surface of the dielectric film 129 and ferroelectric body 17. The second conductive film is actually a pair of films, comprising an iridium-oxide film 135 and a titanium nitride film 137. These films are formed by sputtering, the iridium-oxide film 135 being formed first. The thickness of the iridium-oxide film 135 is one thousand angstroms (1000 Å). The thickness of the titanium-nitride film 137 depends on the etching conditions in a later etching step for which the titaniumnitride film will be used to form part of an etching mask. A typical thickness is two thousand angstroms (2000 Å)

Figure 51:
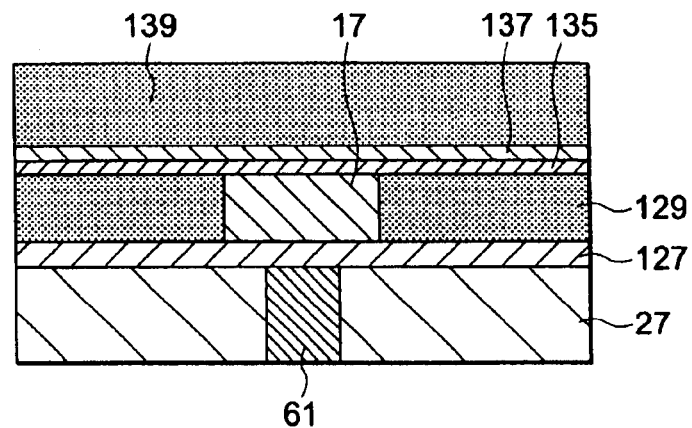

Referring to FIG. 51, the eleventh fabrication step uses CVD to deposit a dielectric film 139 on the titanium-nitride film 137. This dielectric film 139 comprises, for example, silicon dioxide, silicon nitride, or silicon oxynitride, and is five thousand angstroms (5000 Å) thick.

Figure 52:
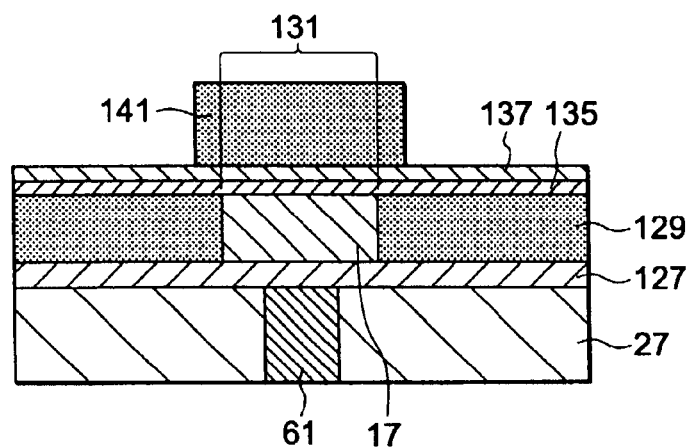

Referring to FIG. 52, the twelfth fabrication step patterns the dielectric film 139 by conventional photolithography and dry etching to leave a mask 141 positioned above the hole 131, which is now filled by the ferroelectric body 17. The mask 141 is wider than the hole 131. In a plan view (not shown), the edges of the mask 141 would be exterior to the edges of the ferroelectric body 17.

Figure 53:
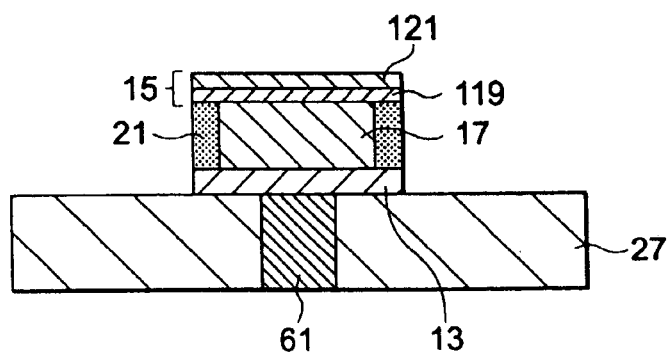

Referring to FIG. 53, the thirteenth fabrication step transfers the pattern of the mask 141 to the first and second conductive films and the dielectric film disposed between them. The transfer is accomplished by three dry etching processes. The first dry etching process, carried out with a mixture of chlorine ($Cl_2$) and oxygen ($O_2$) gases, etches the titanium-nitride film and the iridium-oxide film making up the second conductive film, removing those parts not covered by the mask 141, to form the titanium-nitride layer 121 and iridium-oxide layer 119 making up the top electrode 15 of the capacitor. The second dry etching process, carried out with fluorine gas, etches the dielectric film to form the dielectric lining 21. The sides of the dielectric lining 21 are left substantially vertical. The third dry etching process, carried out with a mixture of chlorine ($Cl_2$) and oxygen ($O_2$) gases, etches the first conductive film to form the bottom electrode 13.

The steps described above complete the formation of the capacitor 11. A detailed description of the remaining steps, which form the second interlayer dielectric film 57, second conductor 63, wiring pattern 123, and passivation layer 125, will be omitted.

Although the process described above leaves the titanium nitride layer 121 as part of the top electrode 15, if desired, the titanium nitride layer 121 can be removed by wet etching with a solution of ammonia and hydrogen peroxide, commonly referred to as ammonia peroxide.

As another variation of this process, the high-temperature annealing step performed at 750° C. to form a final crystalline structure in the ferroelectric body 17 can be carried out before chemical-mechanical polishing, immediately after the lower-temperature (450° C.) annealing of the ferroelectric film 133.

The fifth embodiment is suitable for high-density integration, because the capacitor 11 has straight vertical sides, and neither the dielectric lining 21 nor the bottom electrode 13 projects beyond the edges of the top electrode 15.

As a sixth embodiment of the invention, the fabrication process of the fifth embodiment may be modified to include a stopper film in the dielectric lining 21 of the fifth embodiment.

Figure 54:
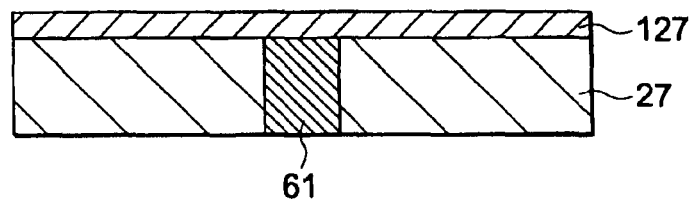
FIGS. 54, 55, 56, 57, 58, 59, 60, 61, and 62 illustrate steps in the fabrication of another stacked memory cell embodying the invention.

Referring to FIG. 54, the first five steps of the fabrication process are the same as in the fifth embodiment, the fifth step being the sputtering of an iridium oxide film 127 one thousand angstroms (1000 Å) thick onto the substrate 27.

Figure 55:
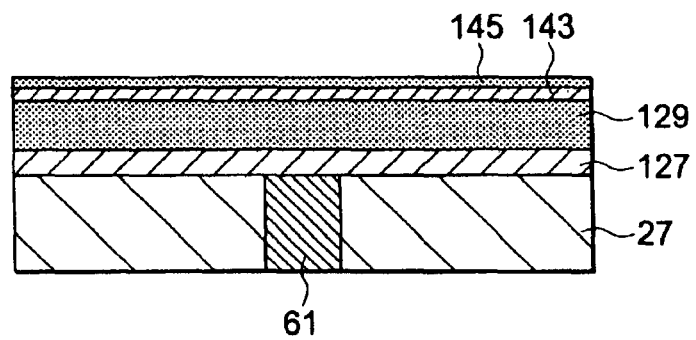

Referring to FIG. 55, the sixth fabrication step deposits a dielectric film 129 of silicon dioxide, silicon nitride, or silicon oxynitride on the first conductive film 127 by CVD. The dielectric film 129 is two thousand angstroms (2000 Å) thick. Next, a stopper film 143 is sputtered onto the surface of the dielectric film 129. The stopper film 143 is an iridium-oxide film five hundred angstroms (500 Å) thick. Then a dielectric film 145 is deposited on the stopper film 143 by CVD. This dielectric film is a silicon dioxide, silicon nitride, or silicon oxynitride film one thousand angstroms (1000 Å) thick.

Figure 56:
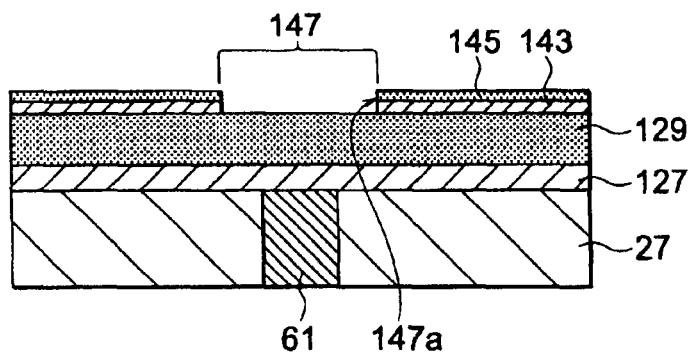

Referring to FIG. 56, the seventh fabrication step forms a hole 147 in the stopper film 143 and dielectric film 145 over the location of the first conductor 61 in the region in which the ferroelectric capacitor will be formed. In this step, the dielectric film 145 is first patterned by conventional photolithography and dry etching to expose the surface of the stopper film 143 in the area of the hole 147. The width of the exposed area is greater than the width of the first conductor 61. The dielectric film 145 now serves as an etching mask while the stopper film 143 is etched with a mixture of chlorine ($Cl_2$) and oxygen ($O_2$) gases. The edges 147a of the resulting hole are disposed outward of the edges of the first conductor 61.

Figure 57:
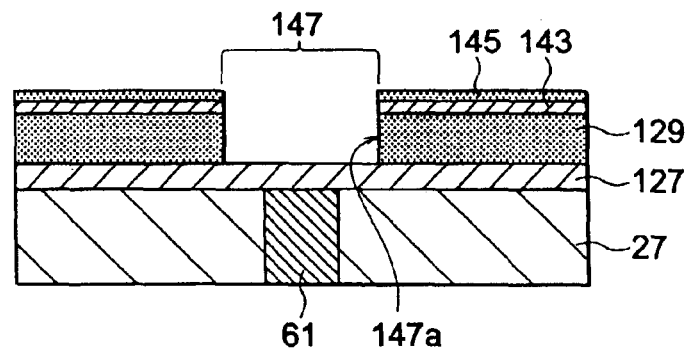

Referring to FIG. 57, the eighth fabrication step extends the hole 147 through the dielectric film 129 to the surface of the first conductive film 127 by conventional dry etching, the dielectric film 145 and stopper film 143 now functioning as an etching mask. The inside walls 147a of the hole 147 are substantially vertical, and the width of the completed hole 147 is equal to or greater than its depth.

Figure 58:
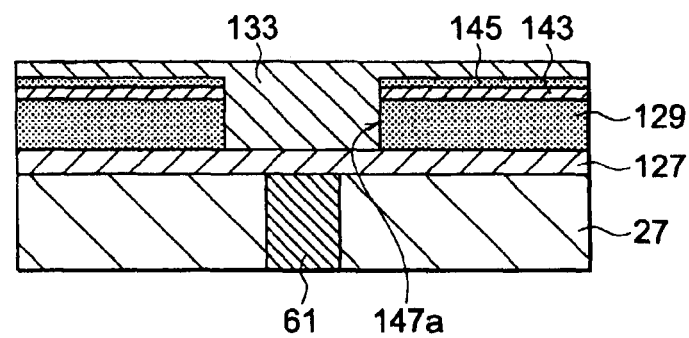

Referring to FIG. 58, the ninth fabrication step covers the surface of the dielectric film 145 and fills the hole 147 with a ferroelectric film 133 of strontium bismuth tantalate by the sol-gel method, as in the fifth embodiment. The ferroelectric film 133 is then heated in an oxygen atmosphere at 450° C. for one hour.

Figure 59:
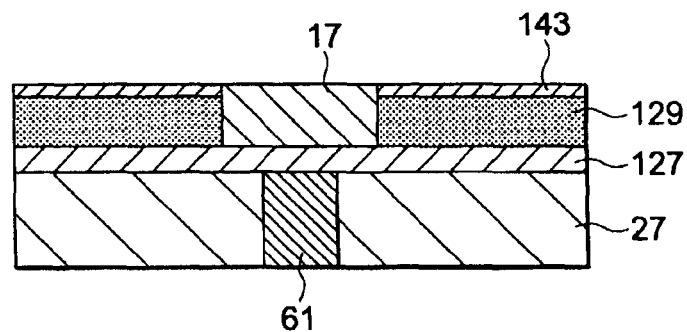

Referring to FIG. 59, the tenth fabrication step removes the ferroelectric film by chemical-mechanical polishing down to the surface of the stopper film 143, forming the ferroelectric body 17. An ammonia-based slurry including silica particles is used. The dielectric film overlying the stopper film 143 is also removed. The chemical-mechanical polishing process halts automatically when the surface of the stopper film 143 is exposed. Following chemical-mechanical polishing, the ferroelectric body 17 is annealed by heating the device to 750° C. for sixty minutes in an oxygen atmosphere.

Figure 60:
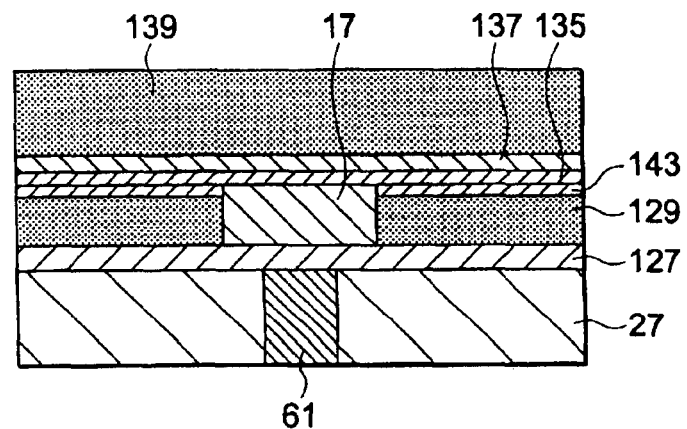

Referring to FIG. 60, the eleventh fabrication step sputters a second conductive film comprising an iridiumoxide film 135 one thousand angstroms (1000 Å) thick and a titanium nitride film 137 two thousand angstroms (2000 Å) thick onto the surface of the stopper film 143 and ferroelectric body 17, as in the fifth embodiment. The thickness of the titanium-nitride film 137 may be varied according to etching conditions in the later etching step for which the titanium-nitride film serves as a mask. Next, a dielectric film 139 of silicon dioxide, silicon nitride, or silicon oxynitride five thousand angstroms (5000 Å) thick is deposited by CVD on the titanium-nitride film 137.

Figure 61:
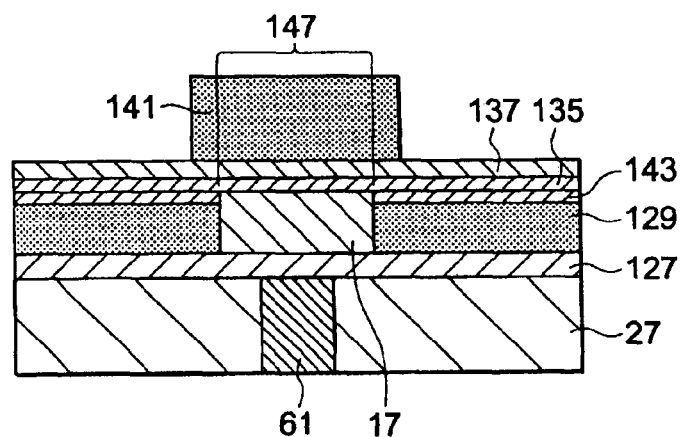

Referring to FIG. 61, the twelfth fabrication step patterns the dielectric film 139 by conventional photolithography and dry etching to leave a mask 141, as in the fifth embodiment.

Figure 62:
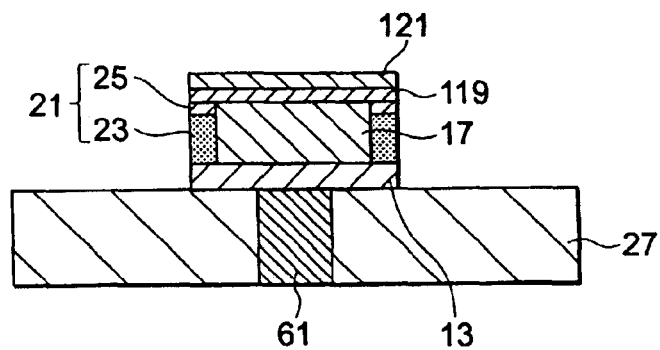

Referring to FIG. 62, the thirteenth fabrication step transfers the pattern of the mask 141 to the layers below, using a mixture of chlorine ($Cl_2$) and oxygen ($O_2$) gases to etch the titanium-nitride film 137, the iridium-oxide film 135, and the stopper film 143, using fluorine gas to etch the dielectric film 129, and using a mixture of chlorine ($Cl_2$) and oxygen ($O_2$) gases to etch the first conductive film 127. This step completes the formation of the capacitor 11. The dielectric lining 21 now includes a dielectric layer 23, comprising the remaining part of the dielectric film 129, and a stopper layer 25, comprising the remaining part of the stopper film 143. The bottom electrode 13 comprises the remaining part of the first conductive film 127. The top electrode 15 comprises an iridium-oxide layer 119 and a titanium-nitride layer 121 as in the fifth embodiment, but the titanium-nitride layer 121 may be removed by wet etching with ammonia peroxide.

Further steps, descriptions of which will be omitted, are carried out to add wiring interconnections as shown in FIG. 44.

The sixth embodiment provides the same effects as the fifth embodiment: a stacked memory cell with small dimensions, in which the capacitor 11 has vertical sides. A further effect is that the iridium-oxide stopper film 143, which has a slow polishing rate, prevents over-polishing.

A still further effect is that since the stopper layer 25 and iridium-oxide layer 119 both comprise iridium oxide, the first stopper layer 25 becomes an extension of the top electrode 15. As a result, the electric field applied to the ferroelectric body 17 is even more uniform than in the fifth embodiment, assuring that the capacitor 11 will operate with stable electrical characteristics.

The stopper film 143 may comprise any material that has a slow polishing rate and does not react with the material of the ferroelectric body 17. Examples of materials that can be used for the stopper film 143, other than the iridium oxide material described above, include iridium (Ir), platinum (Pt), ruthenium (Ru), ruthenium oxide ($RuO_2$), lanthanum-strontium-cobalt oxide ($La_{0.5}Sr_{0.5}CoO_3$), strontium-ruthenium oxide ($SrRuO_3$), and yttrium-barium-copper oxide ($YBa_2Cu_3O_x$, where x is a positive integer). The stopper film 143 may also comprise a plurality of films made from one or more of these materials.

During the fabrication of the invented ferroelectric capacitor and ferroelectric memory devices by the processes described above, the ferroelectric body in the capacitor is never exposed to etching, being formed itself by chemical-mechanical polishing, and being embedded in a dielectric lining 21 that offers protection during the etching of other films and layers. The ferroelectric body therefore maintains its designed shape and size. Since the ferroelectric material is not etched, it does not have to be repeatedly annealed at high temperatures to repair etching damage. Consequently, in a ferroelectric memory device, transistor characteristics do not undergo alterations due to repeated high-temperature annealing. Both planar and stacked memory cells can advantageously incorporate the invented ferroelectric capacitor.

Figure 63:
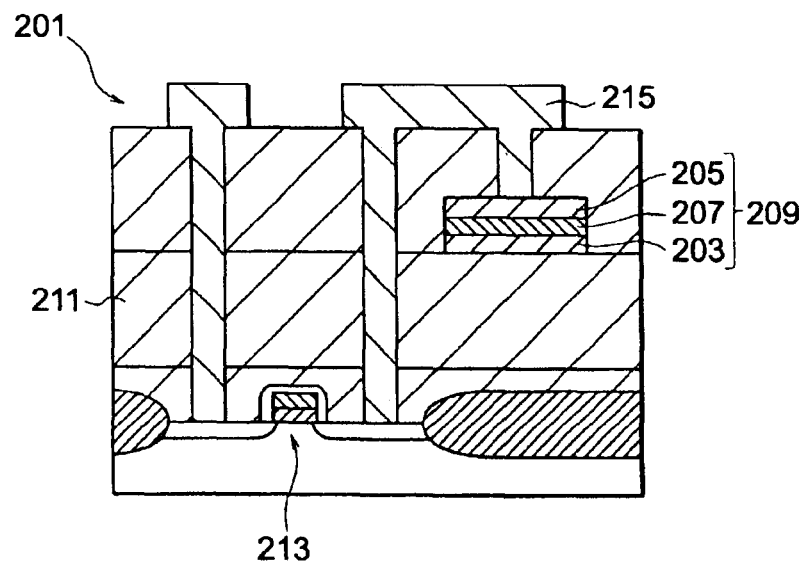
FIG. 63 shows a conventional planar memory cell having a ferroelectric capacitor.

For comparison, FIG. 63 shows a conventional planar ferroelectric memory cell 201 in which a bottom electrode 203, a top electrode 205, and a ferroelectric body 207 are the only components of the capacitor 209. The capacitor 209 is formed on a first interlayer dielectric film 211, and is coupled to a transistor 213 by a conductor 215 as in the second embodiment. The edges of the ferroelectric body 207 are exposed to etching agents (plasma etc.) at least during the etching process that shapes the capacitor 209, and possibly during other etching processes that pattern barrier films and the like (not visible). Damage is inevitable.

Figure 64:
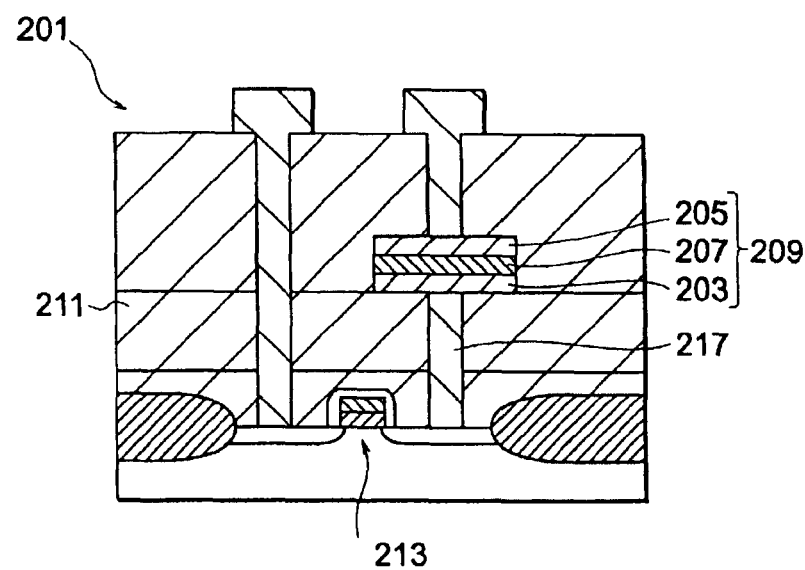
FIG. 64 shows a conventional stacked memory cell having a ferroelectric capacitor.

FIG. 64 shows a conventional stacked ferroelectric memory cell, in which the bottom electrode 203 of the capacitor 209 is coupled by a conductor 217 to the transistor 213. The same problems of damage occur.

Several variations of the above embodiments have already been described, but those skilled in the art will recognize that further variations are possible within the scope of the invention as set forth below.

What is claimed is:

1. A method of fabricating a capacitor on a substrate, comprising:

forming a bottom electrode film on the substrate;

forming a first dielectric film covering the bottom electrode film;

partly removing the first dielectric film to create a first hole exposing the bottom electrode film;

forming a ferroelectric film covering the first dielectric film and filling the first hole;

removing the ferroelectric film from above the first dielectric film, leaving a part of the ferroelectric film, disposed in the first hole, as a ferroelectric body of the capacitor;

forming a top electrode film covering the first dielectric film and the ferroelectric body;

partly removing the top electrode film, leaving a part of the top electrode film covering the ferroelectric body as a top electrode of the capacitor;

partly removing the first dielectric film, leaving a part of the first dielectric film surrounding the ferroelectric body as a dielectric lining of the capacitor; and partly removing the bottom electrode film, leaving a part of the bottom electrode film disposed below the ferroelectric body as a bottom electrode of the capacitor.

2. The method of claim 1, wherein the first hole has a width and a depth, the width being at least equal to the depth.

3. The method of claim 1, wherein said removing the ferroelectric film is carried out by chemical-mechanical polishing, leaving the ferroelectric body with an upper surface even with an upper surface of the first dielectric film.

4. The method of claim 3, wherein said forming a first dielectric film comprises:

forming a dielectric layer on the bottom electrode film, the dielectric layer providing electrical isolation between the bottom electrode and the top electrode; and forming a stopper layer on the dielectric layer, the stopper layer being more resistant than the dielectric layer to said chemical-mechanical polishing.

5. The method of claim 4, further comprising forming a mask on the top electrode film, wherein said partly removing the top electrode film is performed by etching, using said mask as an etching mask;

said partly removing the first dielectric film leaves part of the stopper layer remaining in the dielectric lining; and said partly removing the bottom electrode film is performed by etching, using said mask and the remaining part of the stopper layer as an etching mask.

6. The method of claim 4, wherein said stopper layer and said top electrode film comprise identical materials.

7. The method of claim 6, wherein said stopper layer comprises a material selected from among iridium, iridium oxide, platinum, ruthenium, ruthenium oxide, lanthanum-strontium-cobalt oxide, strontium-ruthenium oxide, and yttrium-barium-copper oxide.

8. The method of claim 6, wherein said stopper layer has a plurality of layers each comprising a material selected from among iridium, iridium oxide, platinum, ruthenium, ruthenium oxide, lanthanum-strontium-cobalt oxide, strontium-ruthenium oxide, and yttrium-barium-copper oxide.

9. The method of claim 1, wherein the ferroelectric film comprises strontium bismuth tantalate.

10. The method of claim 1, wherein the bottom electrode film comprises iridium oxide.

11. The method of claim 1, wherein the bottom electrode film comprises platinum.

12. The method of claim 1, wherein the bottom electrode is wider than the ferroelectric body.

13. The method of claim 1, further comprising:

forming a second dielectric film on the substrate; and partly removing the second dielectric film, leaving a second hole exposing the substrate; wherein said forming a bottom electrode film is performed after said partly removing the second dielectric film, the bottom electrode film covering the second dielectric film and filling the second hole; and said partly removing the bottom electrode film is performed before said forming a first dielectric film, by removing the bottom electrode film from above the second dielectric film, leaving the bottom electrode disposed within the second hole.

14. The method of claim 13, wherein said partly removing the bottom electrode film is performed by chemical-mechanical polishing.

15. The method of claim 1, wherein the top electrode is wider than the ferroelectric body.

16. The method of claim 15, further comprising forming a mask having a certain shape on the top electrode film, said partly removing the top electrode film, said partly removing the first dielectric film, and said partly removing the bottom electrode film transferring a shape of the mask to the top electrode, the dielectric lining, and the bottom electrode.

17. A method of fabricating a planar semiconductor memory element on a semiconductor substrate including a transistor, comprising:

forming a first interlayer dielectric film covering the semiconductor substrate and the transistor;

forming a first contact hole and a second contact hole extending from a surface of the first interlayer dielectric film to respective electrode areas of the transistor;

forming a first conductor filling the first contact hole and the second contact hole;

forming the capacitor on the surface of the first interlayer dielectric film by the method of claim 1;

forming a second interlayer dielectric film covering the first interlayer dielectric film and the capacitor;

forming a third contact hole extending from a surface of the second interlayer dielectric film to the first contact hole, a fourth contact hole extending from the surface of the second interlayer dielectric film to the second contact hole, and a fifth contact hole extending from the surface of the second interlayer dielectric film to the top electrode of the capacitor; and forming a second conductor in the third contact hole, the fourth contact hole, and the fifth contact hole, and on the surface of the second interlayer dielectric film between the fourth contact hole and the fifth contact hole, the second conductor creating an electrical connection from the first conductor in the second contact hole to the top electrode of the capacitor.

18. The method of claim 17, further comprising:

forming a conductive film covering the surface of the first interlayer dielectric film and the first conductor, after said forming a first conductor;

forming a third interlayer dielectric film covering the conductive film, before said forming the capacitor; and partly removing the conductive film and the third interlayer dielectric film between said forming the capacitor and said forming a second interlayer dielectric film, leaving a first part of the conductive film disposed above the first contact hole, and a second part of the conductive film disposed above the second contact hole, the first part of the conductive film being wider than the first contact hole, the second part of the conductive film being wider than the second contact hole.

19. The method of claim 17, wherein said forming a third contact hole is carried out by etching, using a first etching mask for the third contact hole and the fourth contact hole, and a second etching mask for the fifth contact hole.

20. A method of fabricating a stacked semiconductor memory element on a semiconductor substrate including a transistor, comprising:

forming a first interlayer dielectric film covering the semiconductor substrate and the transistor;

forming a first contact hole and a second contact hole extending from a surface of the first interlayer dielectric film to respective electrode areas of the transistor;

forming a first conductor filling the first contact hole and the second contact hole;

forming the capacitor on the surface of the first interlayer dielectric film by the method of claim 16, the bottom electrode of the capacitor being disposed above the second contact hole and being electrically coupled to the first conductor in the second contact hole;

forming a second interlayer dielectric film covering the first interlayer dielectric film and the capacitor;

forming a third contact hole extending from a surface of the second interlayer dielectric film to the first contact hole, and a fourth contact hole extending from the surface of the second interlayer dielectric film to the top electrode of the capacitor; and forming a second conductor in the third contact hole and the fourth contact hole.

21. The method of claim 20, further comprising:

forming a barrier layer covering the surface of the first interlayer dielectric film and the first conductor, between said forming a first conductor and said forming the capacitor; and partly removing the barrier layer between said forming the capacitor and said forming a second interlayer dielectric film by etching, using an etching mask that covers at least the capacitor.

22. The method of claim 21, wherein said etching mask is left to form part of the second interlayer dielectric film.

23. The method of claim 21, further comprising:

forming a second dielectric film covering the first interlayer dielectric film and the first conductor, after said forming a first conductor;

forming a stopper film covering the second dielectric film;

forming a second hole in the second dielectric film and the stopper film over the second contact hole;

forming a barrier film covering the stopper film, filling the second hole in the stopper film and the second dielectric film; and removing the barrier film from above the stopper film by chemical-mechanical polishing before said forming the capacitor, leaving a part of the barrier film, disposed in the second hole, as the barrier layer, the barrier layer preventing the bottom electrode of the capacitor from reacting chemically with the first conductor in the second contact hole.

24. The method of claim 20, where in said forming a third contact hole is carried out by etching, using a first etching mask for the third contact hole and a second etching mask for the fourth contact hole.

* * * * *